US011622469B2

(12) United States Patent
Waz et al.

(10) Patent No.: US 11,622,469 B2
(45) Date of Patent: Apr. 4, 2023

(54) DATA CENTER CABINET AND REUSABLE TRANSPORT CASTERS FOR A DATA CENTER CABINET

(71) Applicant: Panduit Corp., Tinley Park, IL (US)

(72) Inventors: Tomasz K. Waz, Orland Park, IL (US); James N. Fleming, Naperville, IL (US)

(73) Assignee: Panduit Corp., Tinley Park, IL (US)

( * ) Notice: Subject to any disclaimer, the term of this patent is extended or adjusted under 35 U.S.C. 154(b) by 167 days.

(21) Appl. No.: 17/243,918

(22) Filed: Apr. 29, 2021

(65) Prior Publication Data

US 2021/0345516 A1    Nov. 4, 2021

Related U.S. Application Data

(60) Provisional application No. 63/019,573, filed on May 4, 2020.

(51) Int. Cl.
*H05K 5/02* (2006.01)
*H05K 7/18* (2006.01)
*H05K 5/00* (2006.01)

(52) U.S. Cl.
CPC ........... *H05K 7/183* (2013.01); *H05K 5/0008* (2013.01); *H05K 5/0221* (2013.01); *H05K 5/0226* (2013.01)

(58) Field of Classification Search
None
See application file for complete search history.

(56) References Cited

U.S. PATENT DOCUMENTS

| 32,482 A | 6/1861 | Lane |
| 2,963,734 A | 12/1960 | Huget |
| 4,728,160 A * | 3/1988 | Mondor ................. G06F 1/181 |
| | | 361/679.48 |
| 5,372,262 A | 12/1994 | Benson et al. |
| 5,585,599 A | 12/1996 | Schwenke et al. |
| 5,860,713 A | 1/1999 | Richardson |

(Continued)

FOREIGN PATENT DOCUMENTS

| EP | 2865254 B1 | 8/2017 |
| EP | 3487270 A1 | 5/2019 |

(Continued)

OTHER PUBLICATIONS

Chatsworth Products, Inc.'s Slimframe™ C-Series Cabinet System product brochure; 6 pgs., 2001.

*Primary Examiner* — Xanthia C Cunningham
(74) *Attorney, Agent, or Firm* — Christopher S. Clancy; James H. Williams; Aimee E. McVady

(57) ABSTRACT

A data center cabinet has a base frame with a pair of front vertical posts, first bottom and top side-to-side beams connected to the front vertical posts, a pair of back vertical posts, second bottom and top side-to-side beams connected to the back vertical posts, and front-to-back beams connecting the front vertical posts and back vertical posts. The first and second bottom side-to-side beams each comprise an opening configured to allow a removable transport caster to pass through the opening, a first set of keyholes configured to receive and retain a set of mounting buttons of a first removable transport caster, and a second set of keyholes configured to receive and retain a set of mounting buttons of a second removable transport caster.

13 Claims, 30 Drawing Sheets

(56) References Cited

U.S. PATENT DOCUMENTS

| | | | |
|---|---|---|---|
| 5,921,516 A * | 7/1999 | Ho | A47B 91/00 |
| | | | 248/688 |
| 5,980,008 A | 11/1999 | Stoever | |
| 5,997,117 A | 12/1999 | Krietzman | |
| 6,238,027 B1 | 5/2001 | Köhler et al. | |
| 6,288,894 B1 * | 9/2001 | Schmitt | H05K 5/0234 |
| | | | 312/216 |
| 6,831,225 B2 | 12/2004 | Chandler | |
| 7,065,933 B2 | 6/2006 | Chandler | |
| 7,293,666 B2 | 11/2007 | Bergesch et al. | |
| 7,374,186 B2 | 5/2008 | Mason et al. | |
| D584,252 S | 1/2009 | Lawrence et al. | |
| 8,141,885 B2 | 3/2012 | Fan et al. | |
| 8,490,799 B2 | 7/2013 | Ellison et al. | |
| 8,544,860 B2 | 10/2013 | Fan | |
| 8,985,345 B2 | 3/2015 | Fan et al. | |
| 9,114,819 B2 * | 8/2015 | Tiilikainen | B62B 5/0093 |
| 9,743,543 B2 | 8/2017 | Anderson et al. | |
| 9,943,003 B2 | 4/2018 | Brouwer et al. | |
| 9,981,677 B1 * | 5/2018 | Gross | B62B 3/025 |
| 10,743,666 B2 * | 8/2020 | Werner | A47B 91/005 |
| 2003/0041409 A1 * | 3/2003 | Caporale | B60B 33/0005 |
| | | | 16/19 |
| 2003/0075476 A1 | 4/2003 | Savoie | |
| 2005/0006155 A1 | 1/2005 | Lenkman | |
| 2006/0243690 A1 | 11/2006 | Mollard | |
| 2008/0111332 A1 * | 5/2008 | Nabata | B65D 19/42 |
| | | | 180/19.1 |
| 2008/0218948 A1 * | 9/2008 | Lai | H05K 5/0234 |
| | | | 361/724 |
| 2012/0018397 A1 | 1/2012 | Fan | |
| 2012/0056516 A1 | 3/2012 | Fan | |
| 2012/0062084 A1 * | 3/2012 | Lewis, II | H05K 7/20009 |
| | | | 312/223.1 |
| 2015/0002006 A1 * | 1/2015 | Segroves | H05K 5/0234 |
| | | | 312/265.6 |
| 2017/0034935 A1 * | 2/2017 | Anderson | B62B 5/0006 |
| 2017/0150636 A1 * | 5/2017 | Segroves | H05K 7/14 |
| 2018/0213672 A1 | 7/2018 | Eckberg et al. | |
| 2021/0219446 A1 * | 7/2021 | Curlee | F16F 15/085 |

FOREIGN PATENT DOCUMENTS

| | | |
|---|---|---|
| FR | 2661307 A1 | 10/1991 |
| KR | 101121350 B1 | 3/2012 |

* cited by examiner

DATA CENTER CABINET AND REUSABLE TRANSPORT CASTERS FOR A DATA CENTER CABINET

CROSS REFERENCE TO RELATED APPLICATION(S)

This application claims benefit to U.S. Provisional Patent Application No. 63/019,573, filed on May 4, 2020, the entirety of which is hereby incorporated by reference herein.

FIELD OF THE INVENTION

The present invention generally relates to data center cabinets, and, more specifically, to transport casters for data center cabinets.

BACKGROUND

In typical data center cabinets, transport casters are installed on the data center cabinet at the factory and remain with the data center cabinet. However, since movement of the data center cabinets is limited once they have been delivered and positioned, there does not seem to be a need to have permanent transport casters on every data center cabinet. Therefore, it would be beneficial to have data center cabinets that do not have permanent transport casters, but can have transport casters easily installed and removed in the field to be able to quickly roll data center cabinets around as needed.

SUMMARY

In one example, a data center cabinet comprises a base frame including a pair of front vertical posts, a first bottom side-to-side beam and a first top side-to-side beam positioned between and connected to the pair of front vertical posts, a pair of back vertical posts, a second bottom side-to-side beam and a second top side-to-side beam positioned between and connected to the pair of back vertical posts, a first pair of front-to-back beams positioned between and connected to one of the pair of front vertical posts and one of the pair of back vertical posts, and a second pair of front-to-back beams positioned between and connected to the other of the pair of front vertical posts and the other of the pair of back vertical posts. The first and second bottom side-to-side beams each have an opening configured to allow a removable transport caster to pass through the opening, a first set of keyholes configured to receive and retain a set of mounting buttons of a first removable transport caster, and a second set of keyholes configured to receive and retain a set of mounting buttons of a second removable transport caster.

In another example, a transport caster for use with a data center cabinet comprises a swivel caster and a mounting plate secured to the swivel caster. The mounting plate has a plurality of mounting buttons extending from a top surface of the mounting plate and is configured to be received and retained in a plurality of keyholes in the data center cabinet.

In another example, a method of installing a transport caster on a data center cabinet comprises the steps of: raising the data center cabinet; inserting the transport caster through an opening in a side-to-side beam of the data center cabinet; inserting a mounting button of the transport caster through a keyhole in the side-to-side beam; sliding the transport caster along the side-to-side beam such that the mounting button is retained in the keyhole; and lowering the data center cabinet to rest on the transport caster.

BRIEF DESCRIPTION OF THE DRAWINGS

Certain examples of the present invention are illustrated by the accompanying figures. It should be understood that the figures are not necessarily to scale and that details that are not necessary for an understanding of the invention or that render other details difficult to perceive may be omitted. It should be understood, of course, that the invention is not necessarily limited to the particular examples illustrated herein.

DETAILED DESCRIPTION

Figure 1:
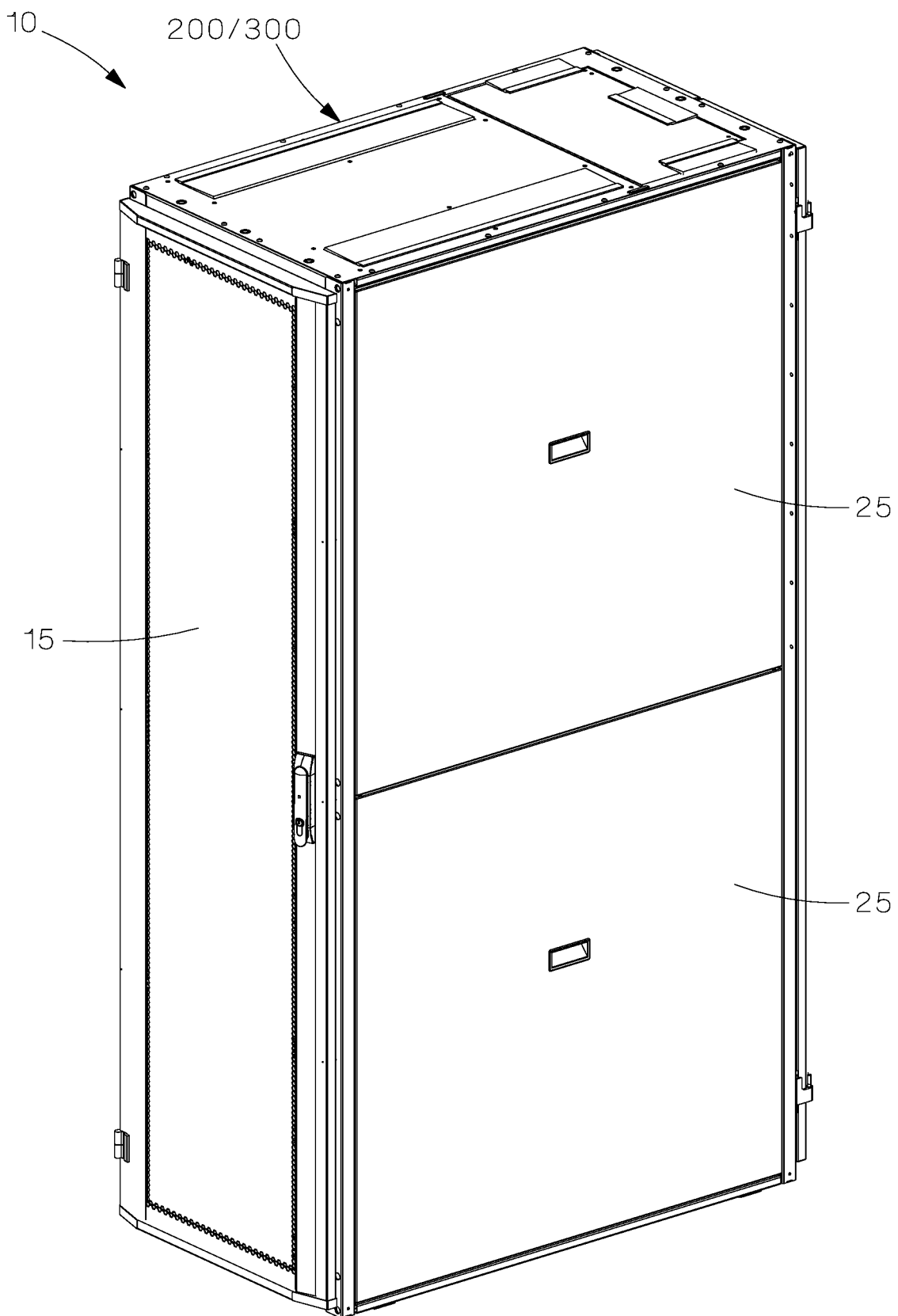
FIG. 1 is a perspective view of an example data center cabinet.
Figure 2:
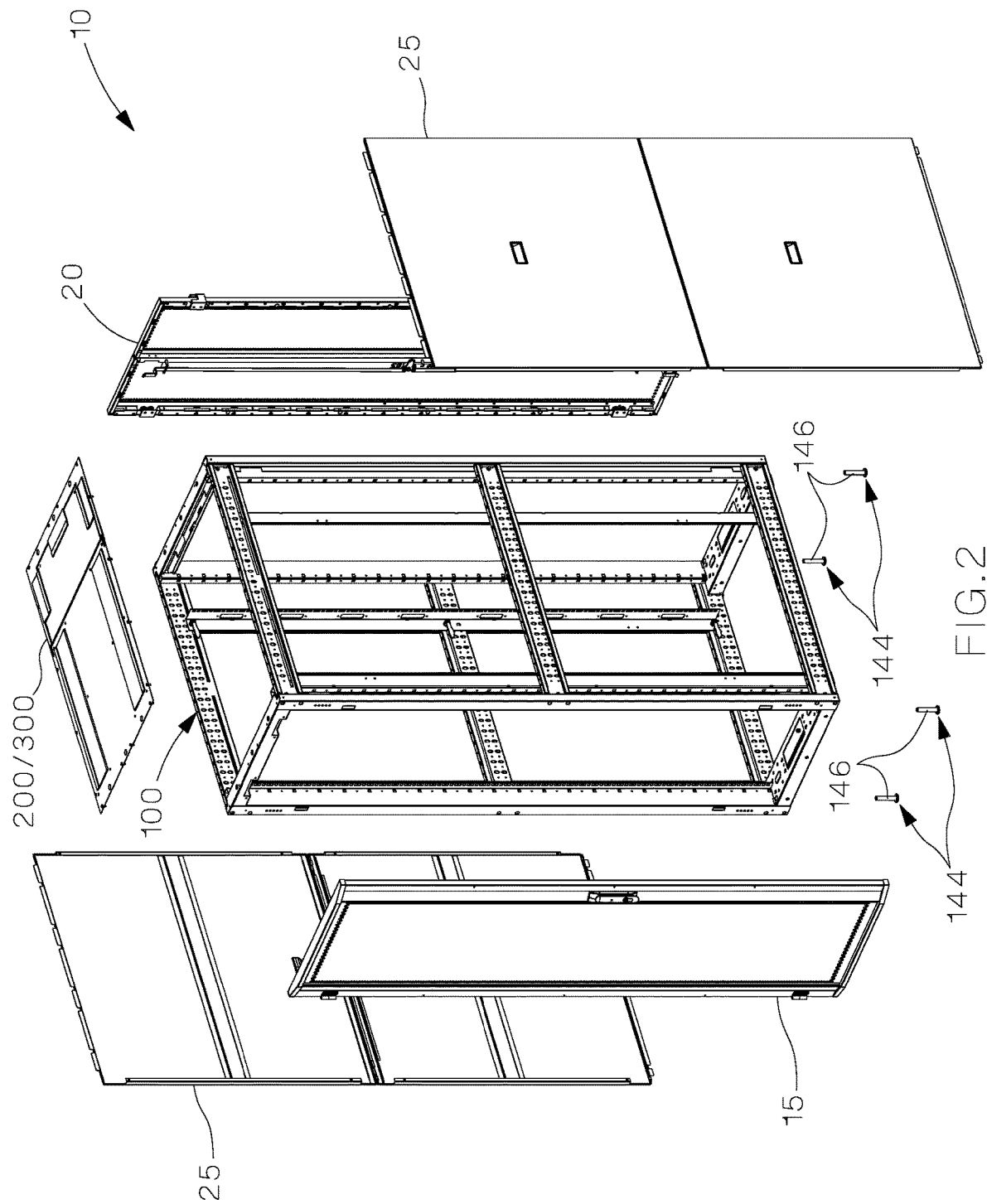
FIG. 2 is an exploded view of the data center cabinet of FIG. 1.
Figure 3:
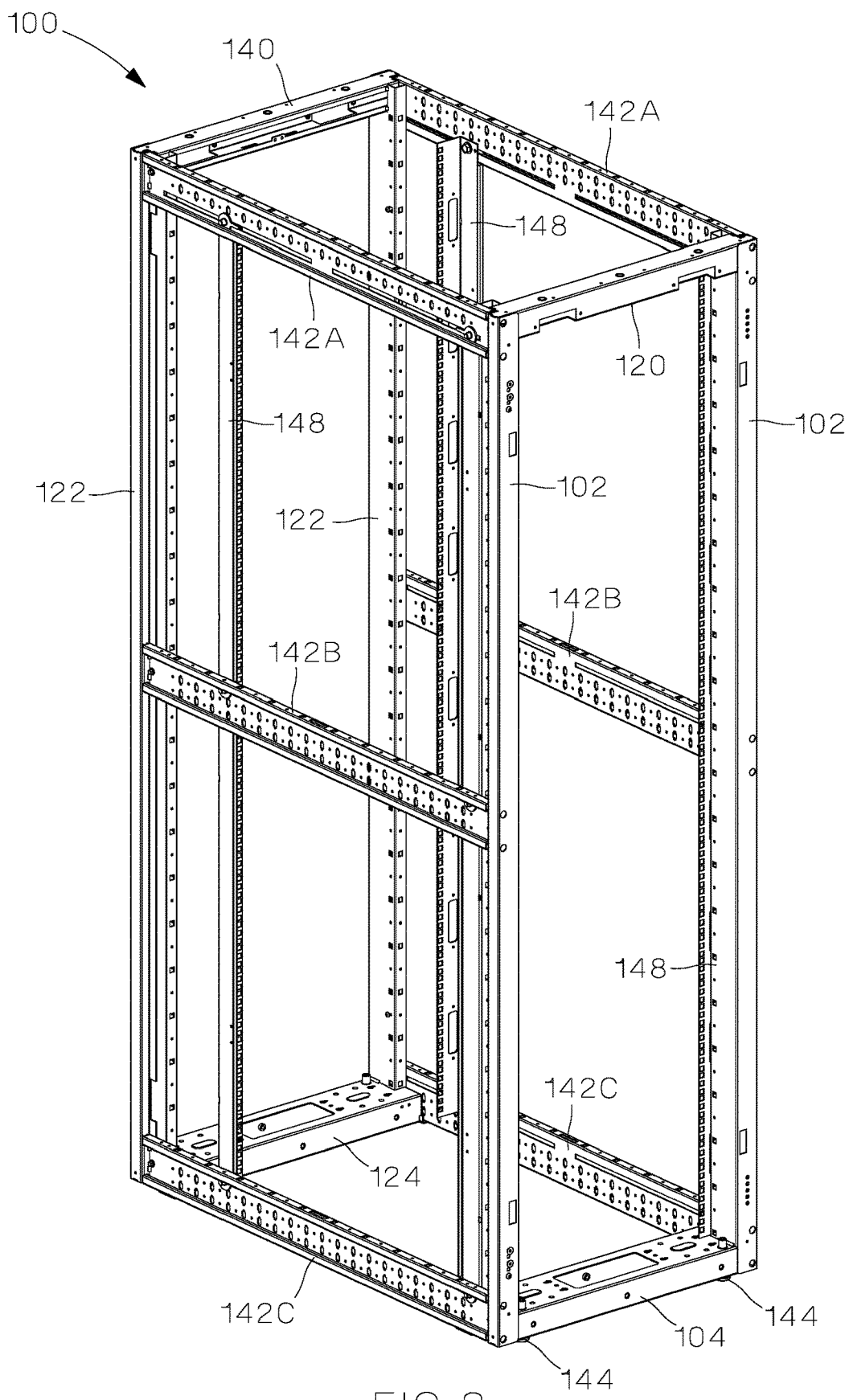
FIG. 3 is a perspective view of the base frame of the data center cabinet of FIG. 1.
Figure 4:
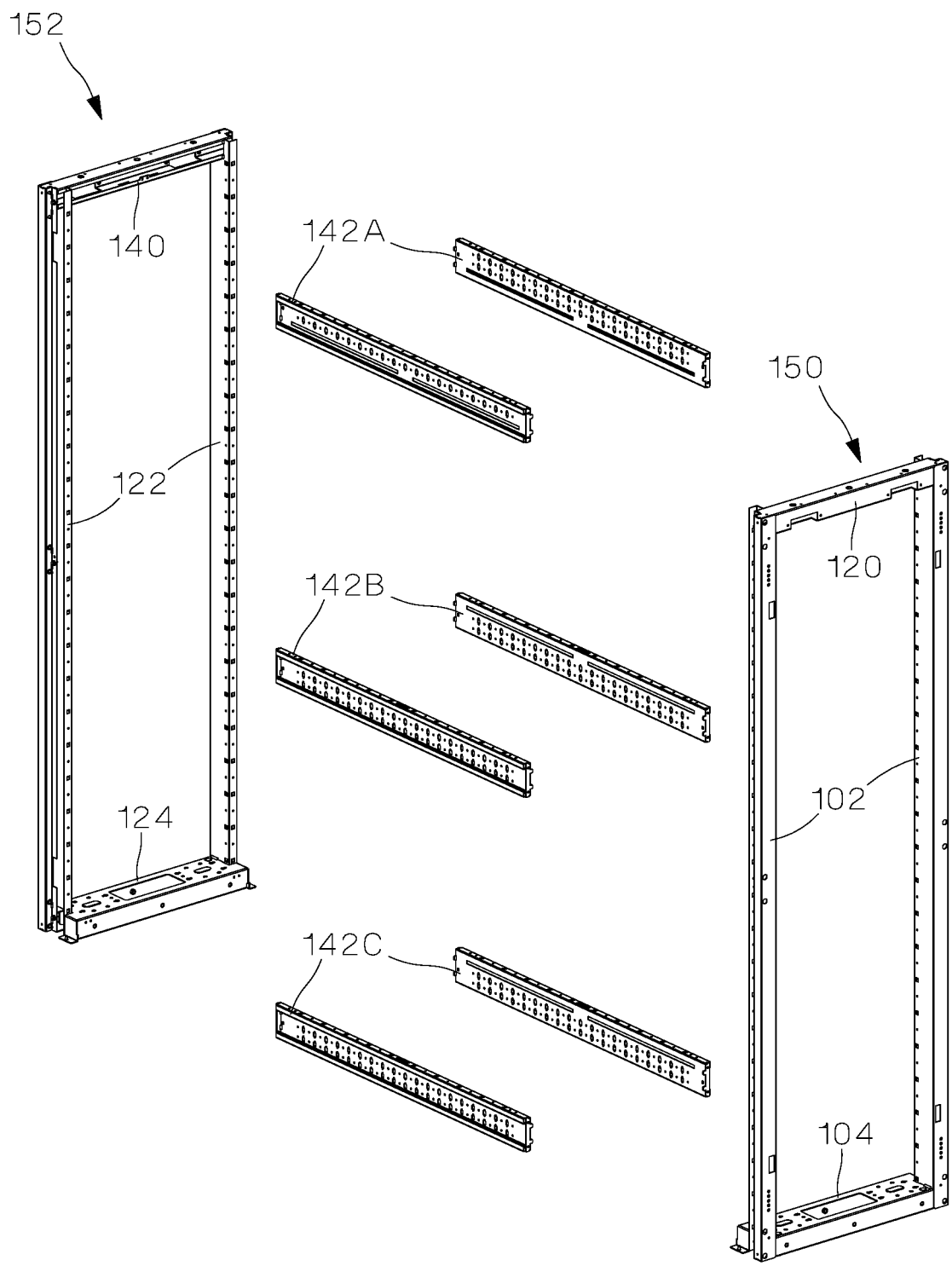
FIG. 4 is an exploded view of a portion of the base frame of FIG. 3.
Figure 5:
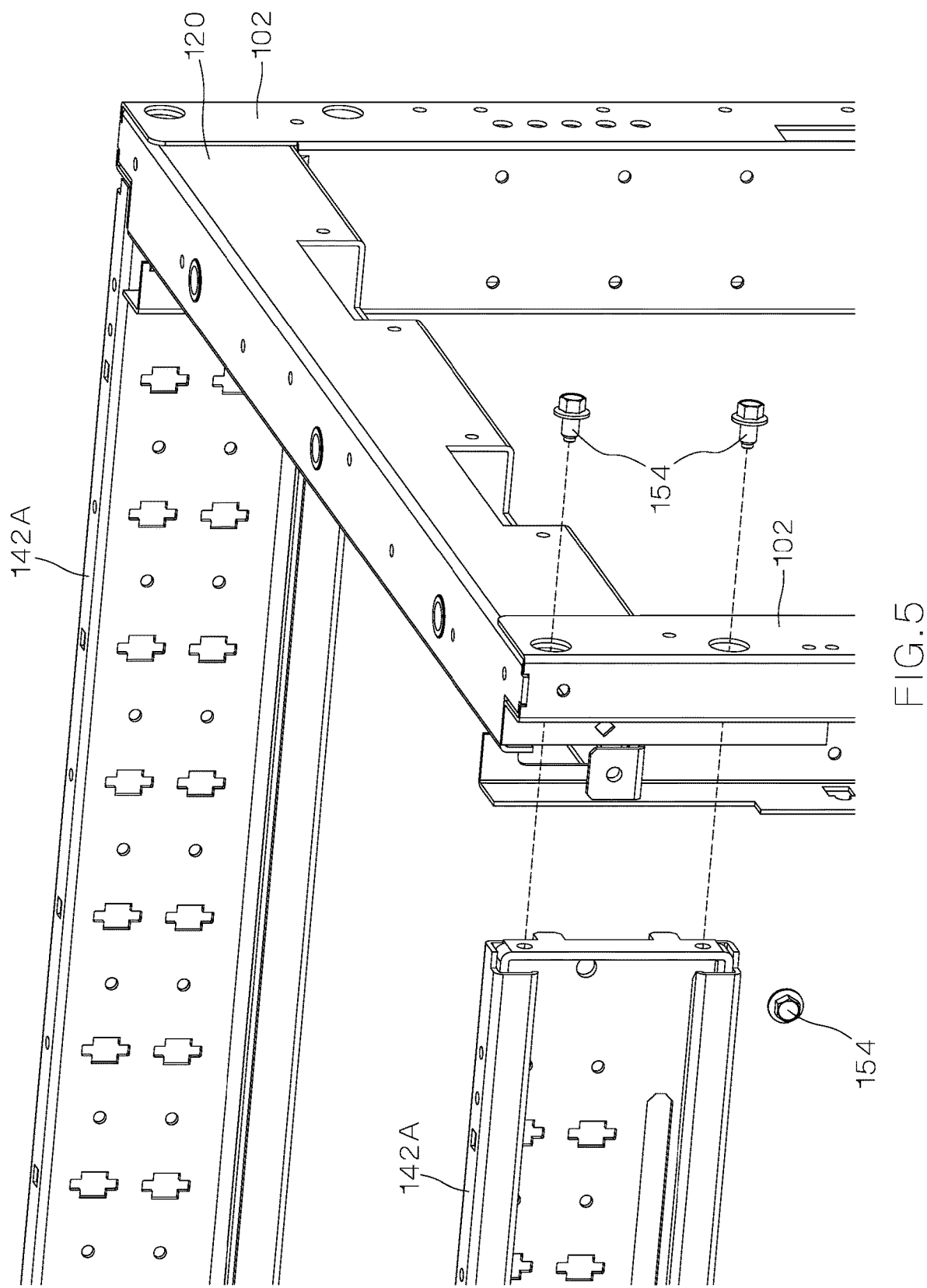
FIG. 5 is an enlarged partial exploded view of the base frame of FIG. 3.
Figure 6:
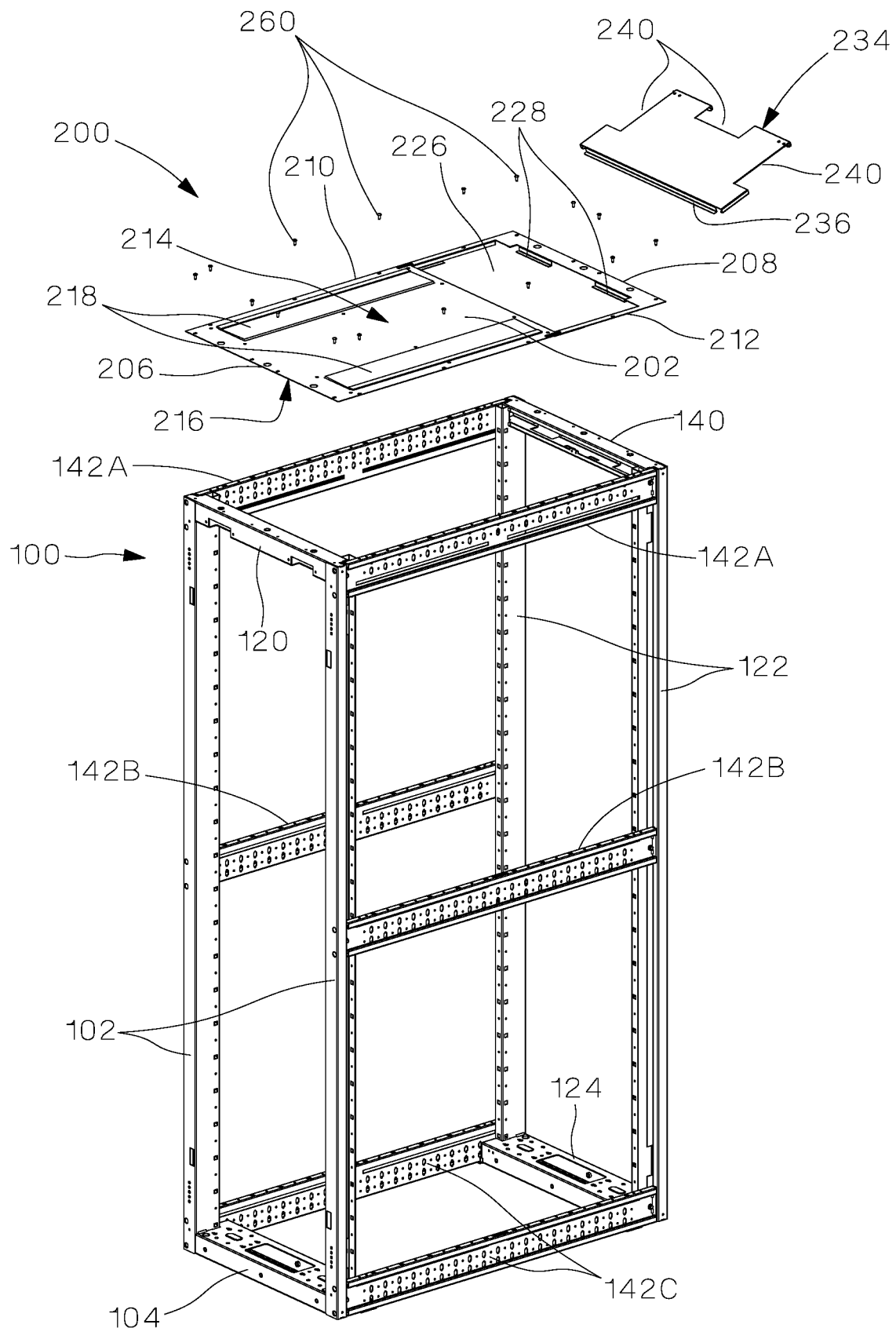
FIG. 6 is an exploded perspective view of a first example top cap with the base frame of the data center cabinet of FIG. 1.
Figure 7:
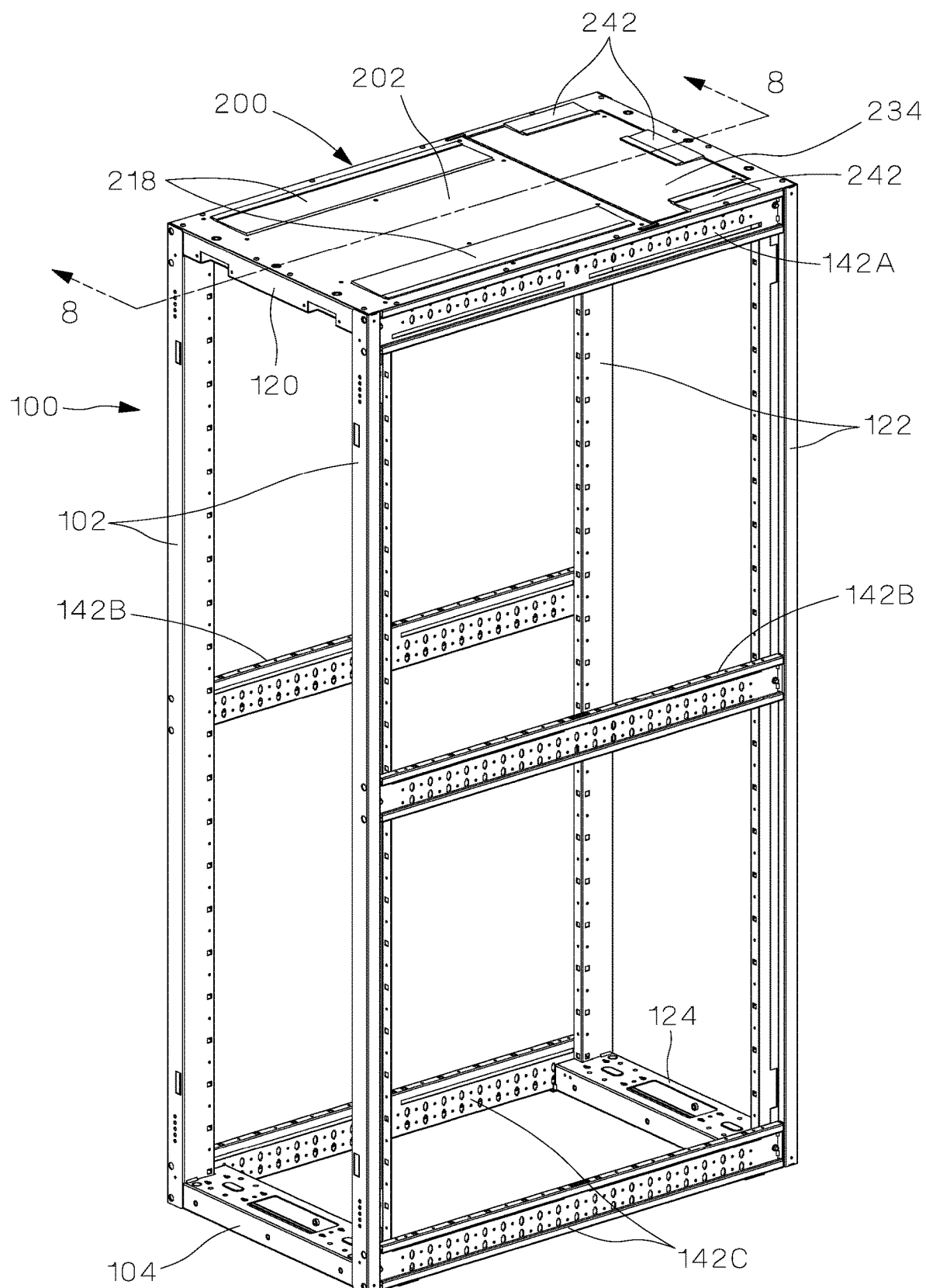
FIG. 7 is a perspective view of the top cap and base frame of FIG. 6 assembled.
Figure 8:
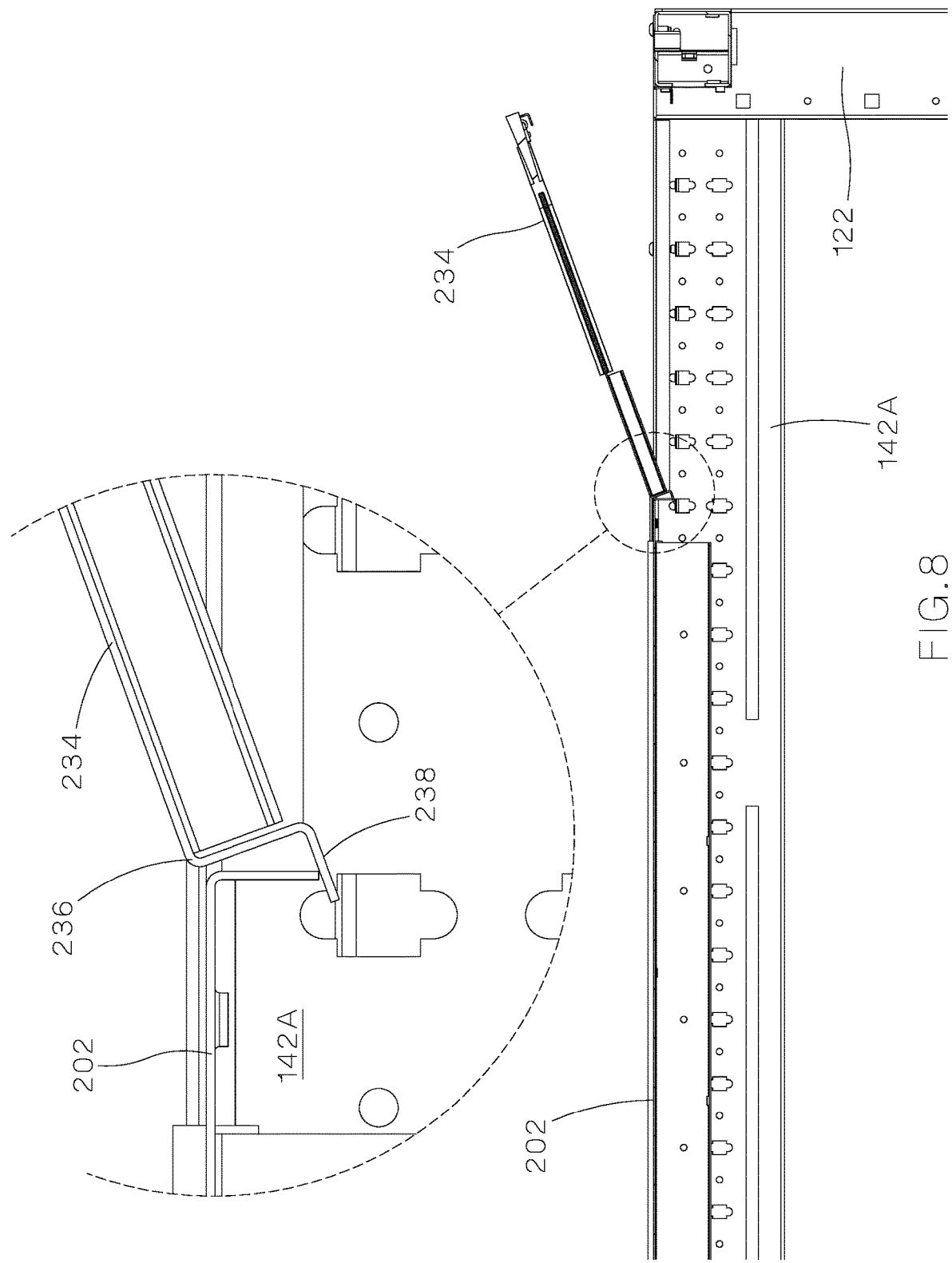
FIG. 8 is a partial cross-section of the top cap and base frame of FIG. 7 taken along the line 8-8 in FIG. 7.

The examples shown and described herein provide a data center cabinet having a top cap that spans the top of the data center cabinet with a single main panel or with two or more separate components, which can reduce or prevent damage during handling, that together span the entire top of the data center cabinet. The top cap has two large openings towards the front of the cabinet that can be used for cabling to pass through, for venting, etc. and one large opening towards the back of the cabinet, which can be accessed by rotating open or removing a hinged door. The hinged door also has one or more cutouts at the edges of the door to allow cabling and power outlet units to pass through. When large diameter power outlet unit plugs need to pass through the opening in the door, the door rotates open to allow them to pass thru. The example top caps also include an electrical bonding feature that provides electrical continuity between the door and the base frame of the data center cabinet.

The examples also provide transport casters that are easy to install and remove from the data center cabinet and are reusable allowing movement of a large number of data center cabinets from the shipping dock to their final destination or around a facility with the reuse of the transport casters, rather than each data center cabinet having its own permanently installed transport casters. These transport casters are installed underneath the base frame without adding to its overall width or depth, which maintains the maneuverability of the data center cabinet. In addition, the transport casters fit in the same location as factory installed casters and, therefore, do not raise the cabinet more than the set of preinstalled casters would, which speeds up installation and allows the data center cabinets to be maneuvered thru limited height passageways.

Referring to FIGS. 1-5, an example data center cabinet 10 is shown that generally includes a base frame 100 and a front door 15, back door 20, side panels 25, and top cap 200, 300 mounted or attached to base frame 100. Front door 15 can be a single door, as shown, that is hinged on one or both sides with one or more handles, can be a double door that is hinged on the sides and opens in the middle, can be solid or perforated, or can have any other features desired for a particular application. Similarly, back door 20 can be a double door, as shown, that is hinged on the sides and opens in the middle, can be a single door as described above, can be solid or perforated, or can have any other features desired for a particular application. Side panels 25 one each side of data center cabinet 10 can be a single panel or multiple panels, as shown, can be removably secured to base frame 100, can be solid or perforated, and can have any other features desired for a particular application.

As best seen in FIGS. 2-5, base frame 100 includes a pair of front vertical posts 102 and a bottom side-to-side beam 104 and top side-to-side beam 120, each positioned between and connected to each of the front vertical posts 102, for example by threaded members. The pair of front vertical posts 102, bottom side-to-side beam 104, and top side-to-side beam 120 together define a front picture frame assembly 150. Similarly, base frame 100 includes a pair of back vertical posts 122 and a bottom side-to-side beam 124 and top side-to-side beam 140, each positioned between and connected to each of the back vertical posts 122, for example by threaded members. The pair of back vertical posts 122, bottom side-to-side beam 124, and top side-to-side beam 140 together define a back picture frame assembly 152.

A top pair of front-to-back beams 142A, middle pair of front-to-back beams 142B, and bottom pair of front-to-back beams 142C are positioned between and connected to corresponding front vertical posts 102 and back vertical posts 122, for example by threaded members 154, to connect front picture frame assembly 150 to back picture frame assembly 152.

Adjustable equipment rails 148 are connected to top, middle, and bottom front-to-back beams 142A, B, C on opposite sides of base frame 100 and are configured to receive and retain electronic components within data center cabinet 10. Equipment rails 148 can be connected to top, middle, and bottom front-to-back beams 142A, B, C with threaded members, such as screws or bolts, with a manual locking mechanism, or in any other manner desired, but are preferably connected such that equipment rails 148 can be adjusted forward and backward within data center cabinet 10 to allow the mounting of electronic components of different sizes.

Adjustable leveling legs 144 are attached to bottom side-to-side beams 104, 124 by threading a threaded shaft 146 of each adjustable leveling leg 144 into a corresponding hole 118, 138 in bottom side-to-side beam 104, 124. In the example shown, a pair of adjustable leveling legs 144 are attached to bottom side-to-side beam 104 and a pair of adjustable leveling legs 144 are attached to bottom side-to-side beam 124 to allow the leveling and height adjustment of base frame 100 of data center cabinet 10.

Figure 12:
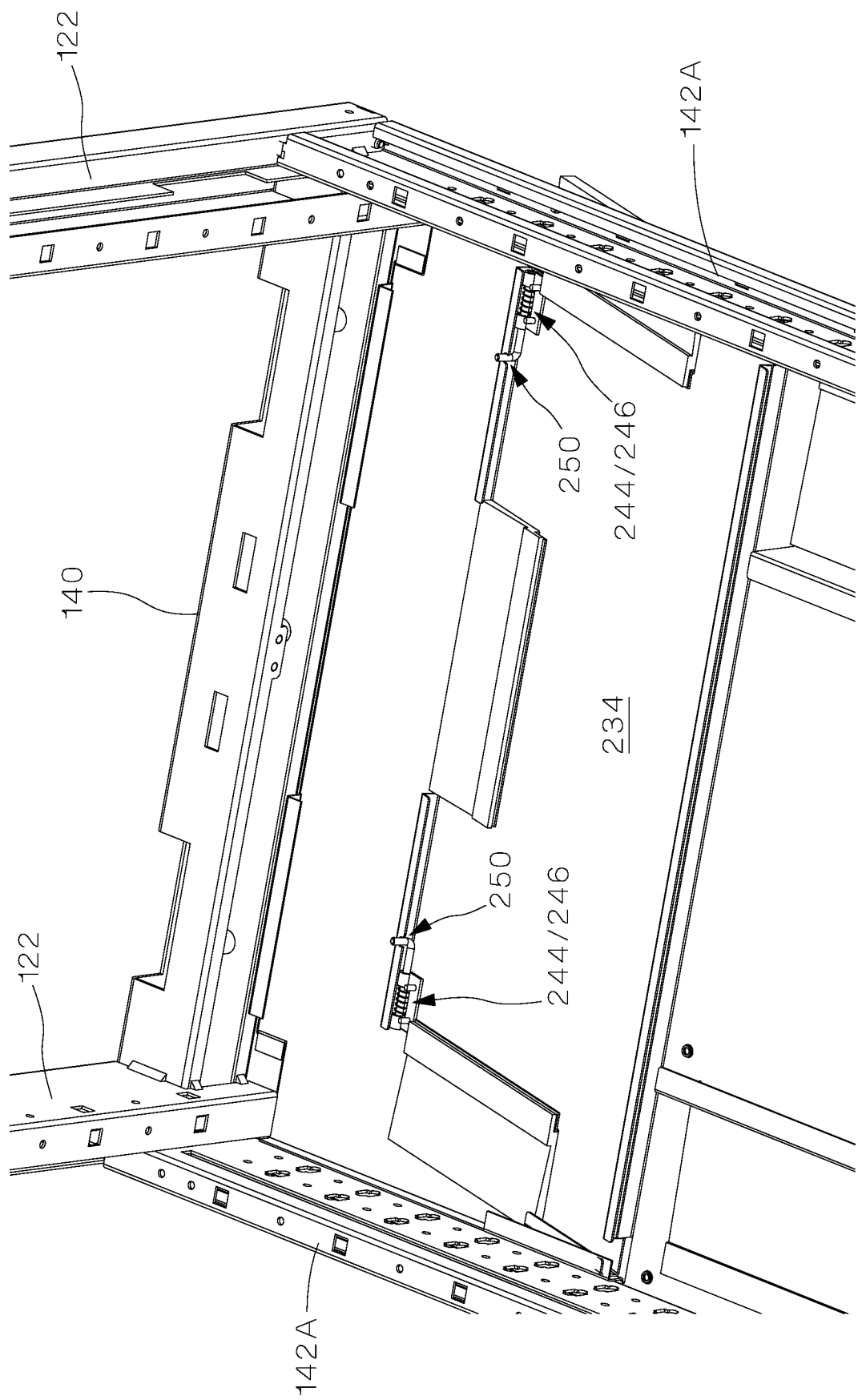
FIG. 12 is a partial bottom perspective view of the top cap and base frame of FIG. 7 with the door in an open position and the latches retained in a retracted position.
Figure 13:
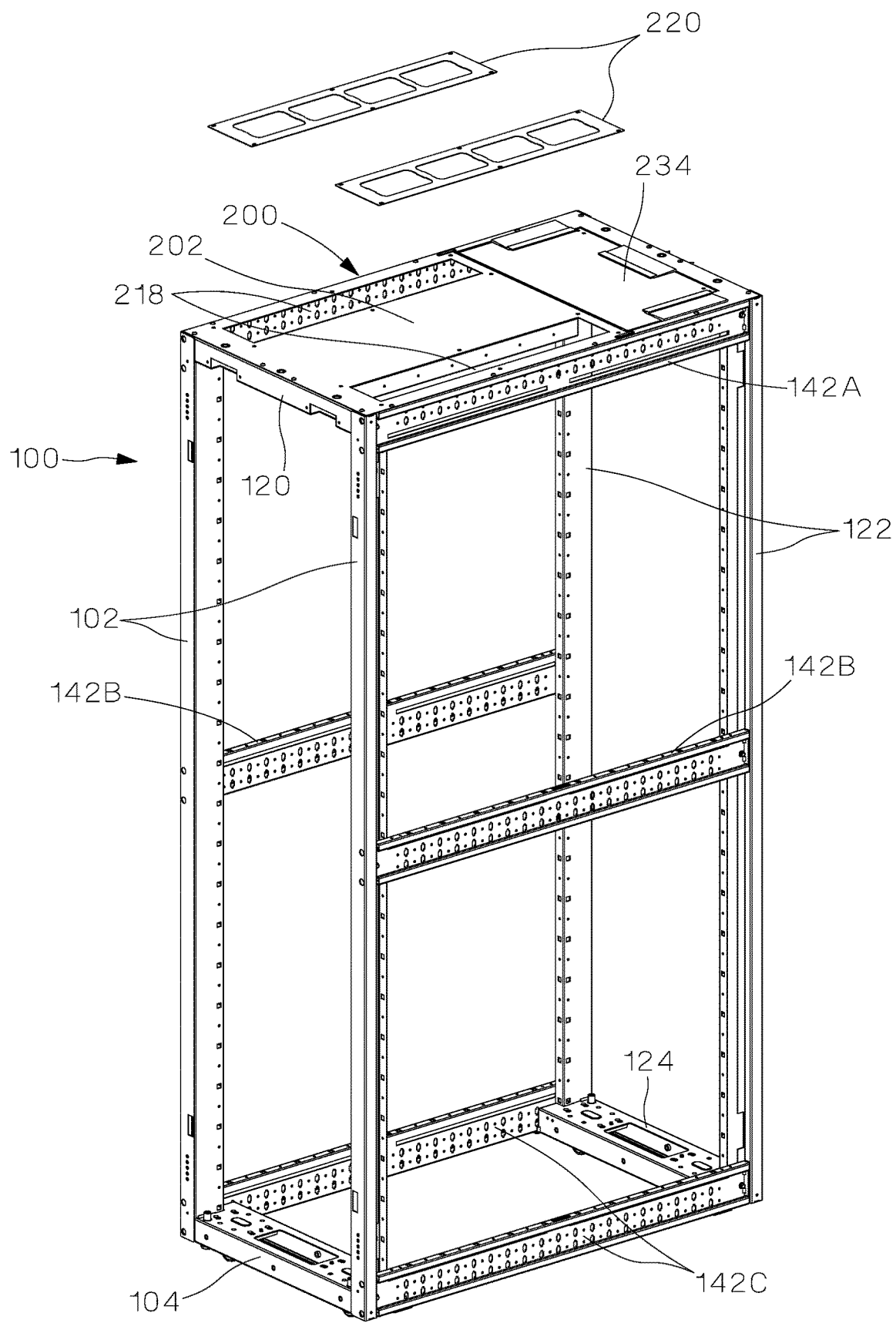
FIG. 13 is a perspective view of the top cap and base frame of FIG. 7 with optional plates to cover the side openings.
Figure 14:
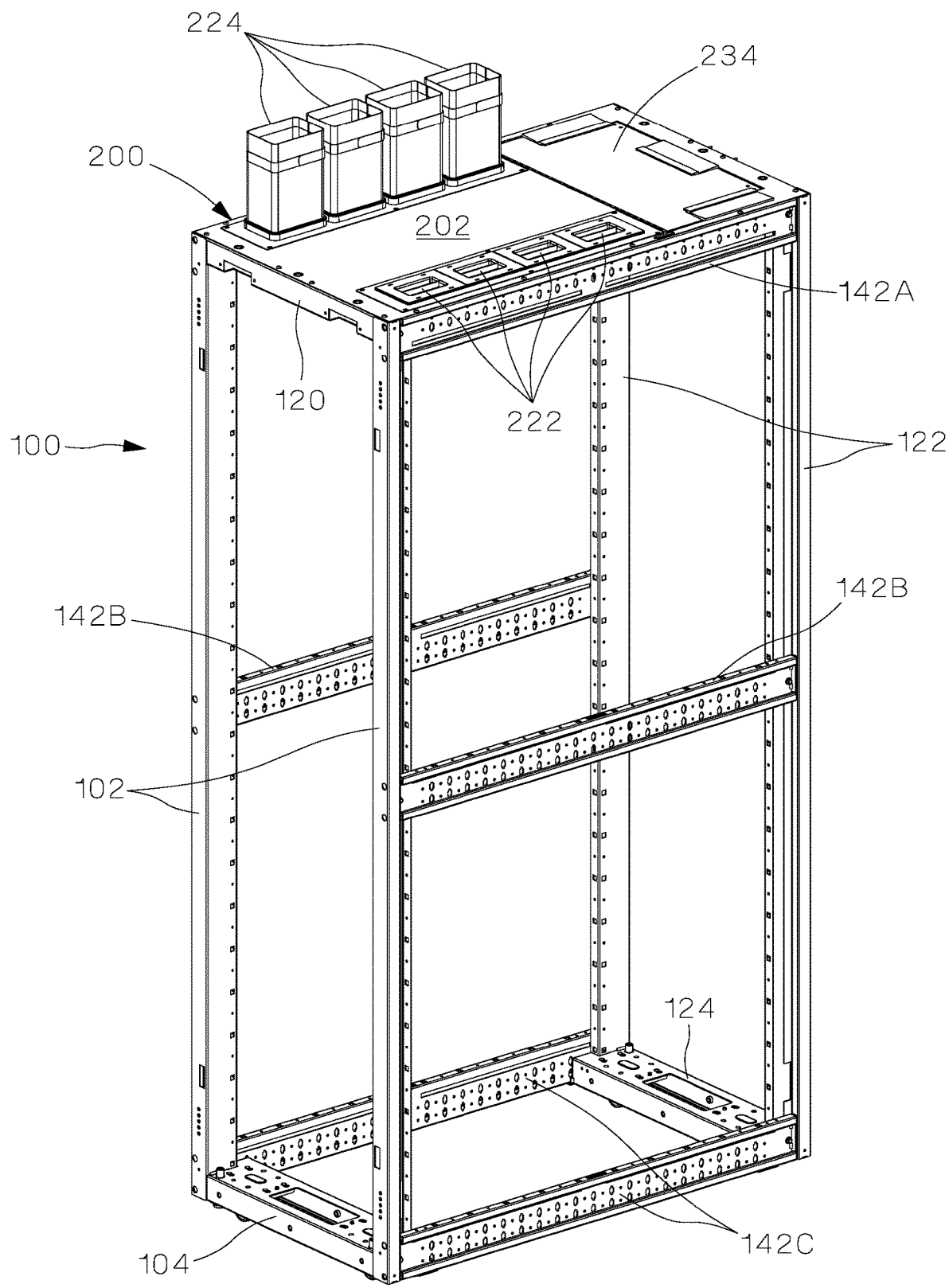
FIG. 14 is a perspective view of the top cap and base frame of FIG. 13 with protection bezels and exhaust vents mounted on the plates.

Referring to FIGS. 6-14, a first example top cap 200 is shown that can be used with data center cabinet 10. Top cap 200 has a single, integral, unitary main panel 202 that spans the entire top of base frame 100 of data center cabinet 10 and is attached to base frame 100 by screws 260 that extend through holes in main panel 202 and into base frame 100. Main panel 202 has a front edge 206, rear edge 208 opposite front edge 206, opposing first and second side edges 210, 212 extending between front edge 206 and rear edge 208, top surface 214 and bottom surface 216. A pair of longitudinal side openings 218 in a front portion of main panel 202 run substantially parallel to first and second side edges 210, 212 and are inset and spaced apart from front, rear, first side, and second side edges 206, 208, 210, 212 of main panel 202. Side openings 218 can be left open to allow the passage of cables. Alternatively, plates 220, with four separate openings, two separate openings, or a single large opening, can be secured to main panel 202 over side openings 218 (FIG. 13), which can be used to attach brush seal strips to prevent thermal leakage from data center cabinet 10, attach protection bezels 222 to cover side openings 218, or attach cool boots 224 such as Panduit Part No. CTGN3X5 to seal off cabinet top cap openings (FIG. 14).

Figure 9:
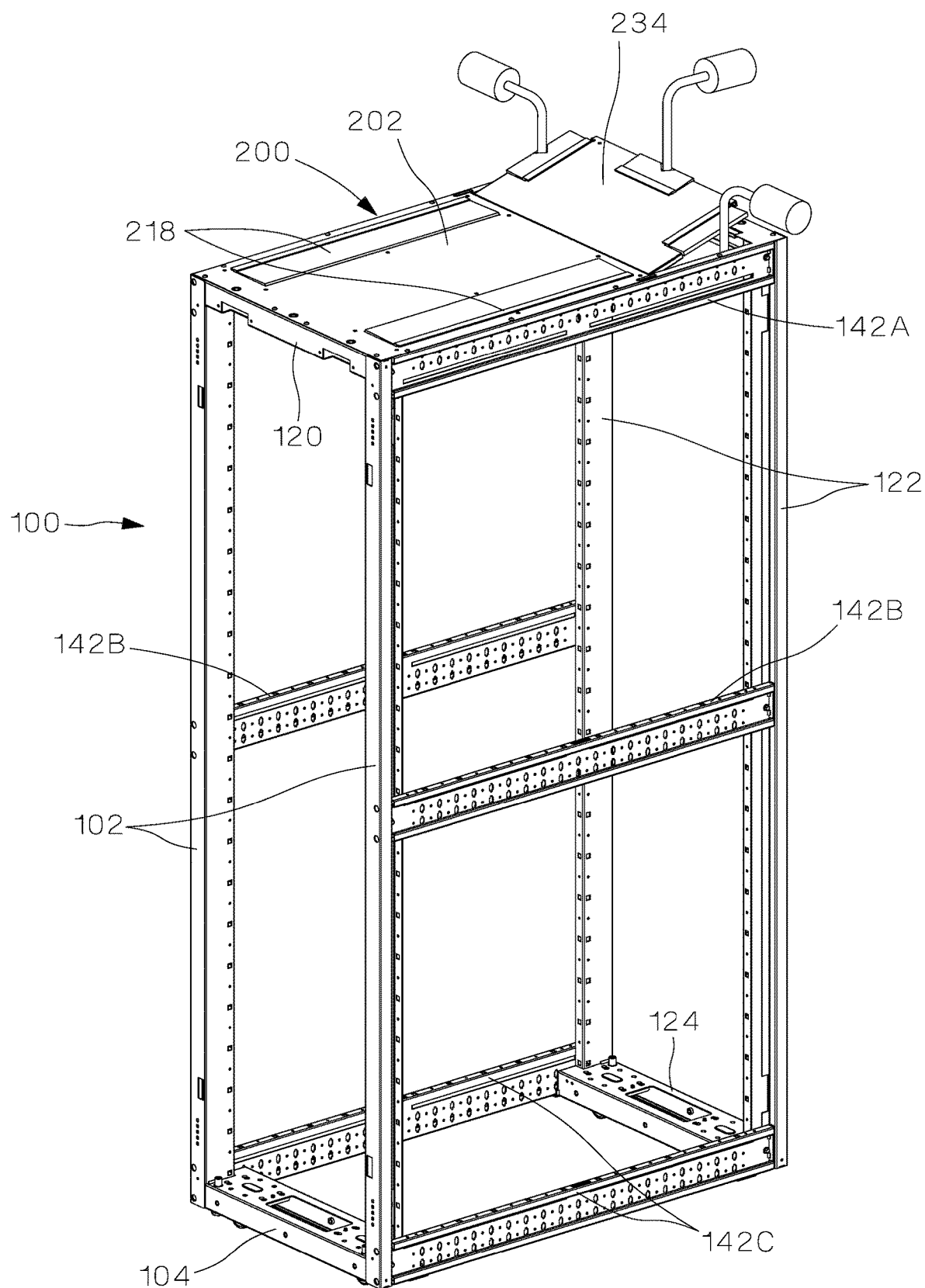
FIG. 9 is a perspective view of the top cap and base frame of FIG. 7 with the door rotated to an open position and power outlet unit cords passing through the apertures in the door.
Figure 10:
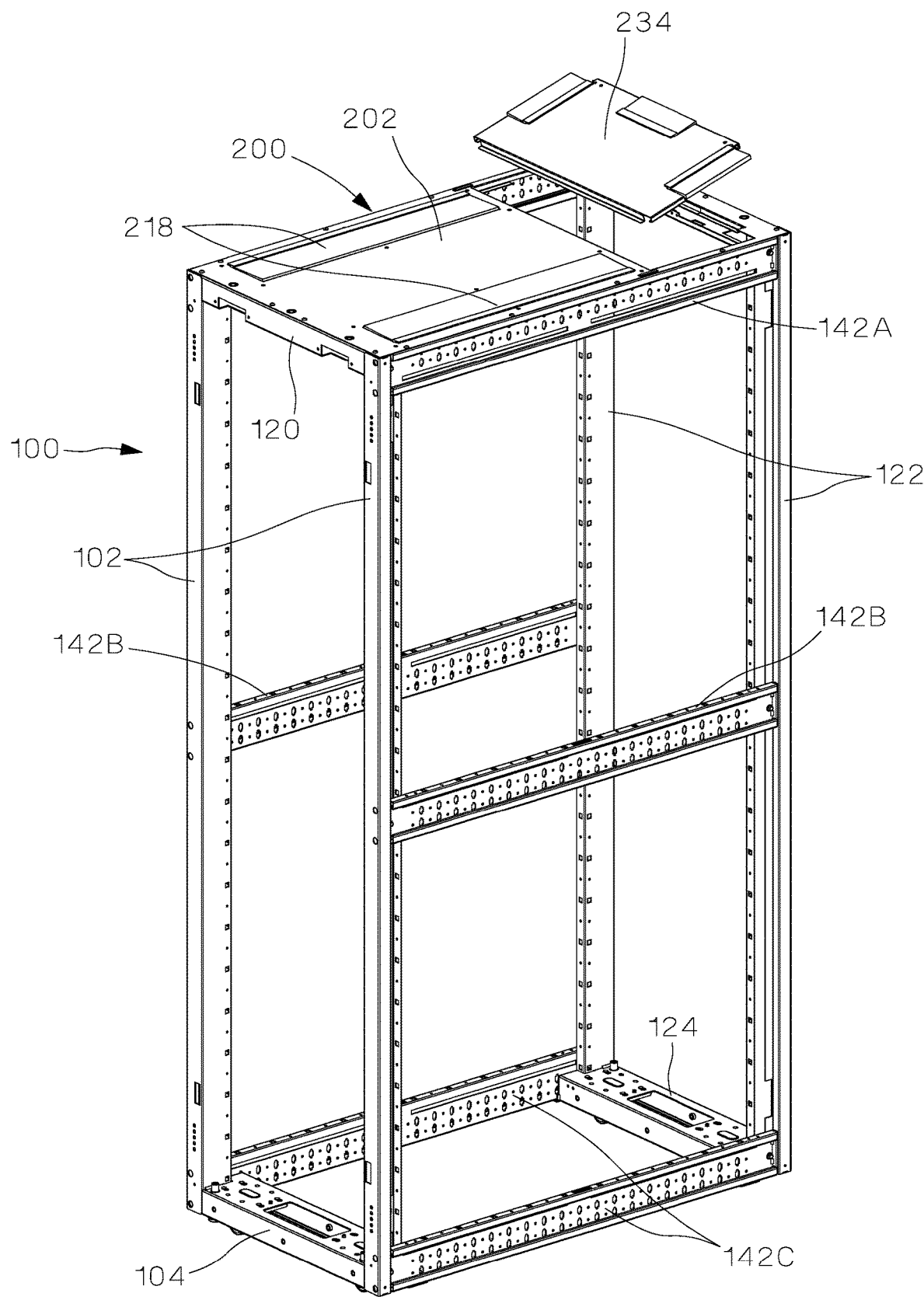
FIG. 10 is a perspective view of the top cap and base frame of FIG. 7 with the door being removed.

A large rear opening 226 is also formed through a rear portion of main panel 202 and is also inset and spaced apart from front, rear, first side, and second side edges 206, 208, 210, 212 of main panel 202. A removable door 234 is hinged to main panel 202 and is positioned over opening 226. Removable door 234 has an outwardly extending flange 238 that extends from and is slightly offset from a first end 236 of door 234. Flange 238 is positioned under main panel 202 to hinge door 234 to main panel 202 and allow door 234 to be rotated between an open position (FIGS. 8-9) and a closed position (FIG. 7) and to also be removed from main panel 202 (FIG. 10). Door 234 also has side and rear cutouts 240 in the side and rear edges of door 234, which form apertures 242 between door 234 and main panel 202 that are preferably large enough to pass cabling and fit power outlet unit cords through. When large diameter power outlet unit plugs need to pass through apertures 242, door 234 can be rotated to an open position to allow passage (FIG. 9). Brush seal strips can also be installed on door 234 and/or main panel 202 to cover apertures 242 to prevent unwanted thermal leakage.

Figure 19:
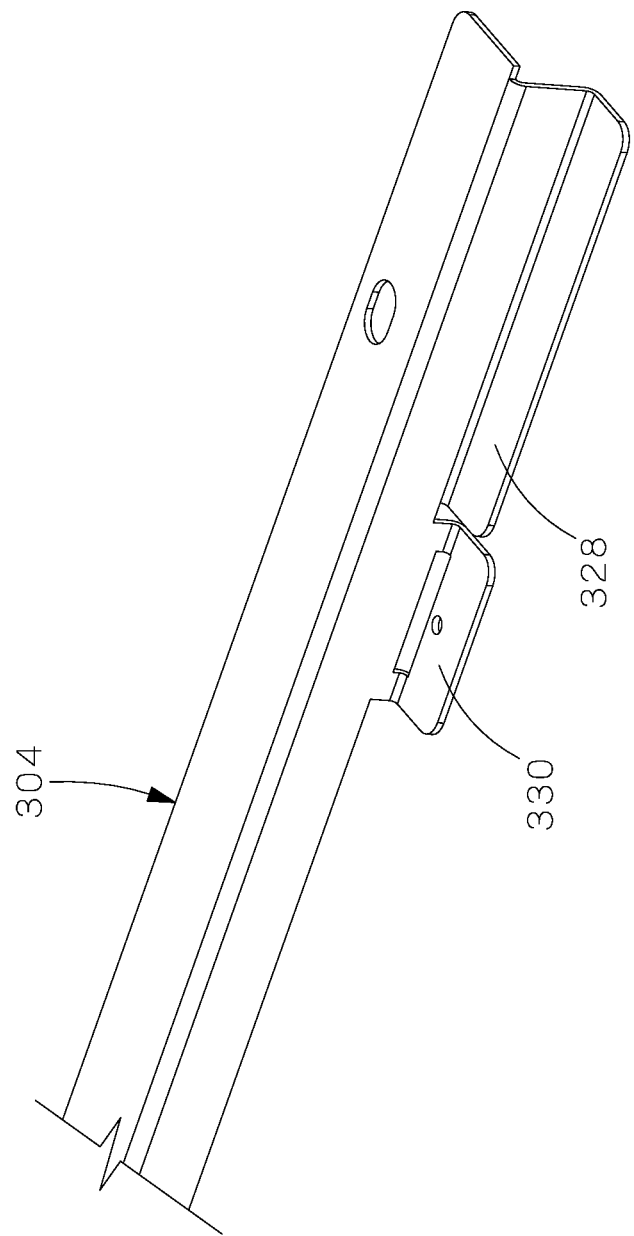
FIG. 19 is a partial perspective view of a rear plate of the top cap of FIG. 15.
Figure 20:
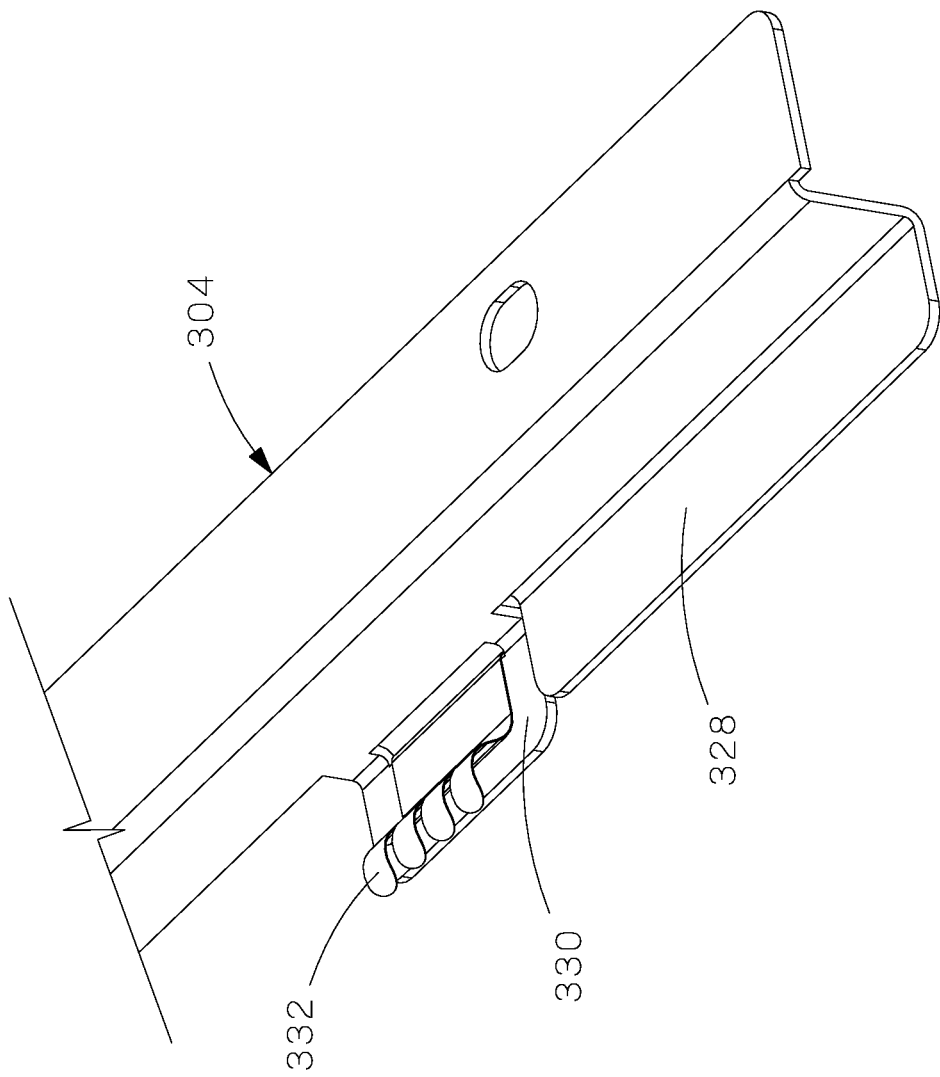
FIG. 20 is a partial perspective view of the rear plate of FIG. 19 with a grounding clip.
Figure 21:
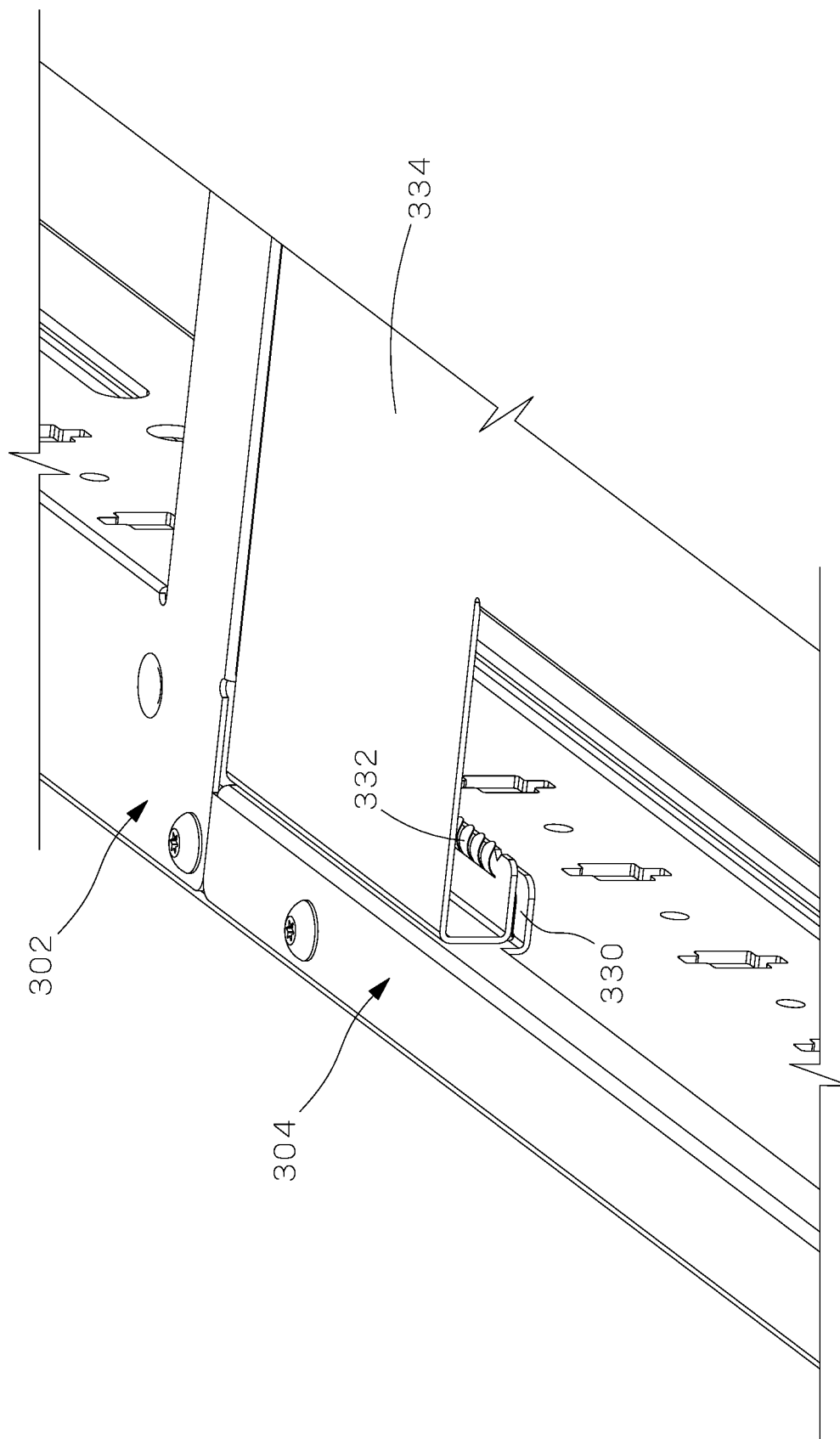
FIG. 21 is a partial perspective view of the top cap of FIG. 16 with a portion of the door in the closed position and engaging the grounding clip of FIG. 20.

When in the closed position, door 234 is supported by door stop flanges 228 that extend from and are offset from main panel 202 and into opening 226. Main panel 202 can also have a grounding tab 330 that extends from main panel 202 into opening 226 and a grounding clip 332 mounted on grounding tab 330 to provide electrical continuity between main panel 202 and door 234 when door 234 is in the closed position, as shown in FIGS. 19-21 and described below with respect to top cap 300.

Figure 11:
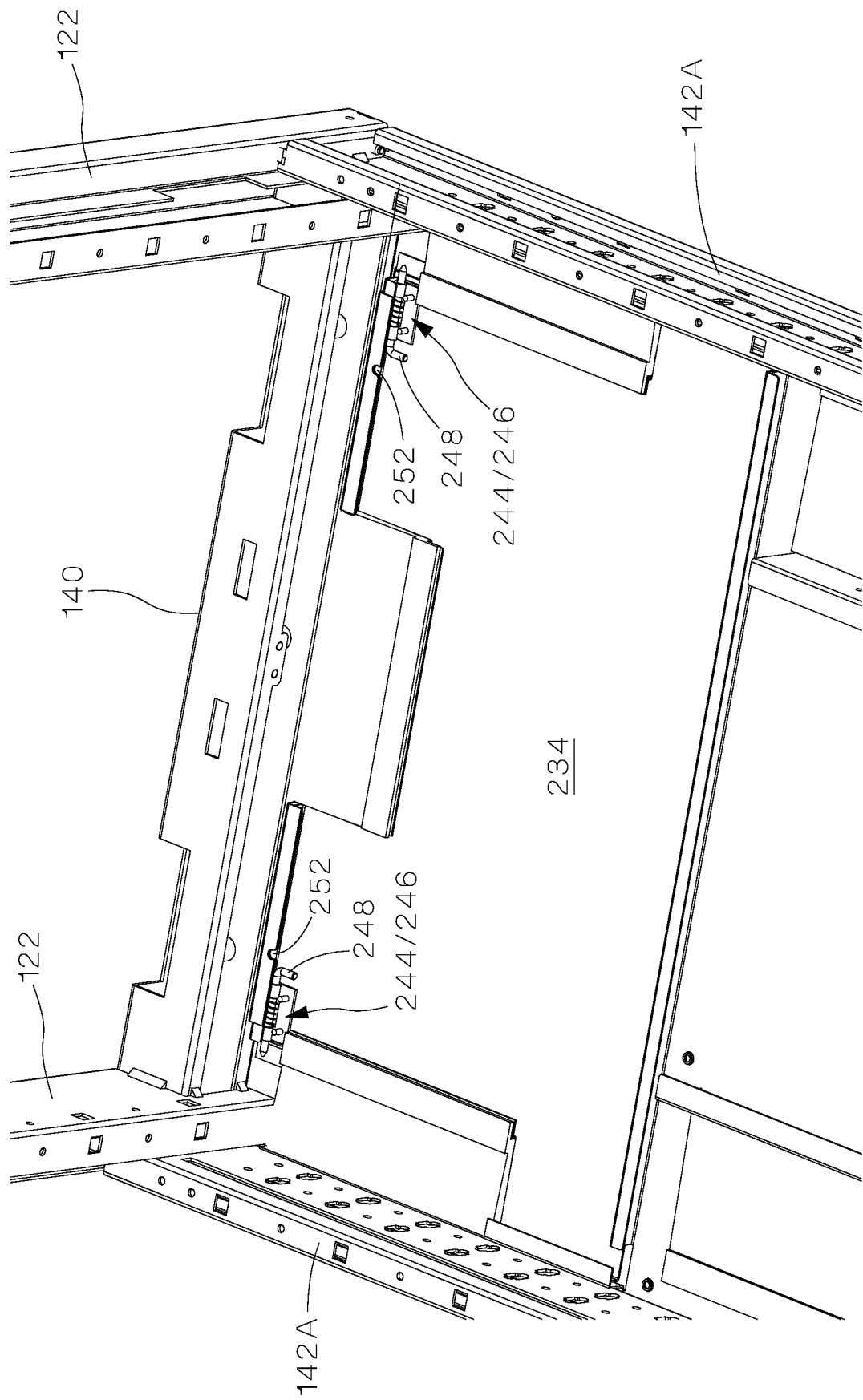
FIG. 11 is a partial bottom perspective view of the top cap and base frame of FIG. 7 with the latches of the door in the extended position.

As best seen in FIGS. 11 and 12, door 234 can also include one or more latches 244 that are configured to prevent rotation and removal of door 234 when in the closed position. In the example shown, latches 244 are retractable spring loaded pins 246 that are positioned on opposing sides of door 234. Pins 248 of retractable spring loaded pins 246 extend from the opposing sides of door 234 and engage bottom surface 216 of main panel 202 to prevent movement of door 234 (FIG. 11). Pins 248 can then be moved to a retracted position, which disengage pins 248 from main panel 202, to allow rotation and movement of door 234. Door 234 can also include a lock feature 250 that is configured to retain retractable spring loaded pin 246 in the retracted position. In the example shown, lock feature 250 is an arcuate notch 252 formed and edge of door 234, which is configured to receive and retain pin 248 of retractable spring loaded pin 246 when pin 248 is retracted and rotated 90°.

Referring to FIGS. 15-21, a second example top cap 300 is shown that can also be used with data center cabinet 10. Top cap 300 is similar to top cap 200, except that rather than having a single, integral, unitary main panel, top cap has two separate components that are installed on base frame 100 adjacent each other. The use of two separate components can reduce the risk of damage being done to top cap 300 when being handled, transported, or installed.

Figure 15:
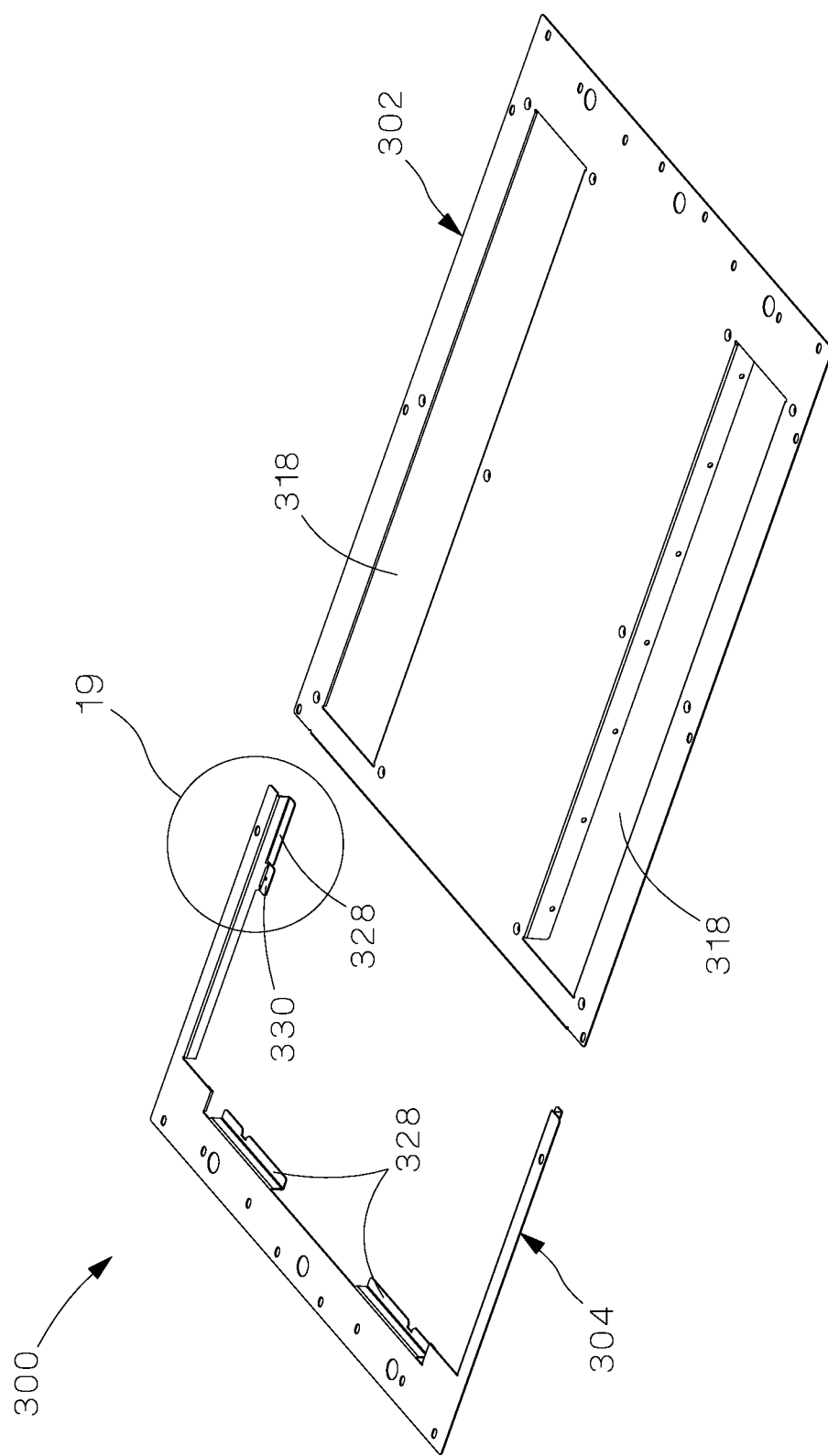
FIG. 15 is an exploded perspective view of a second example top cap without the door.
Figure 16:
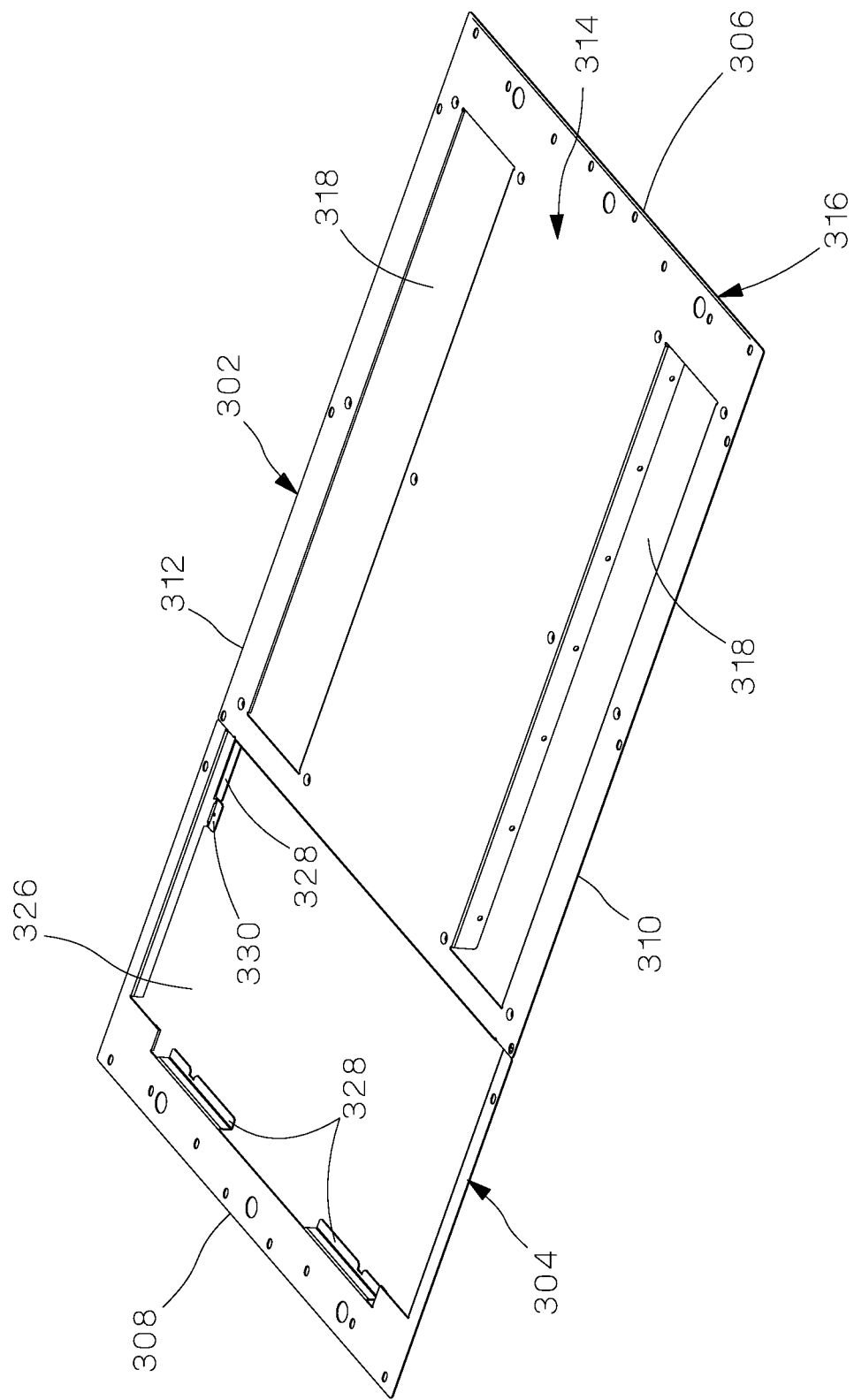
FIG. 16 is a perspective view of the top cap of FIG. 15.
Figure 17:
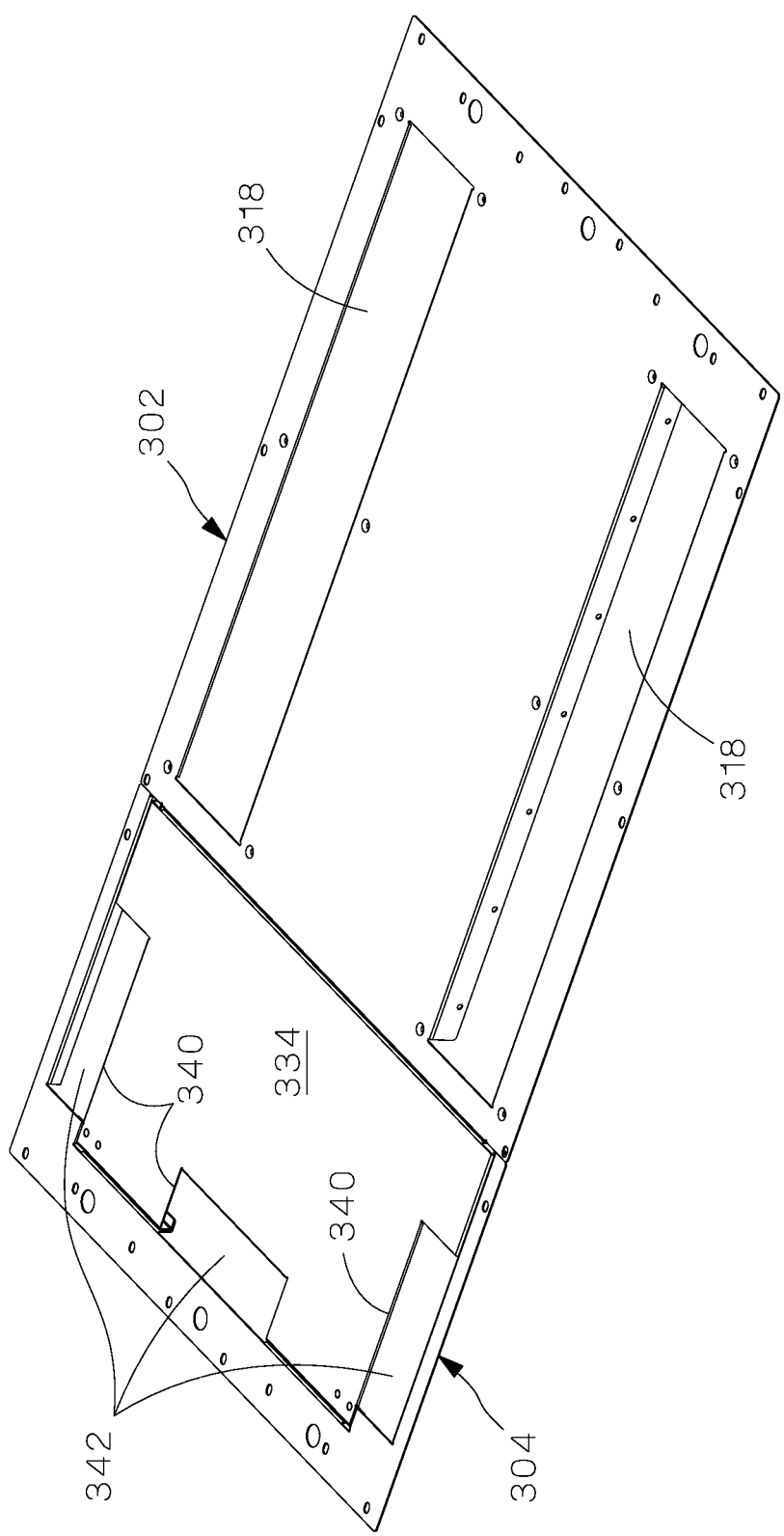
FIG. 17 is a perspective view of the top cap of FIG. 16 with the door.
Figure 18:
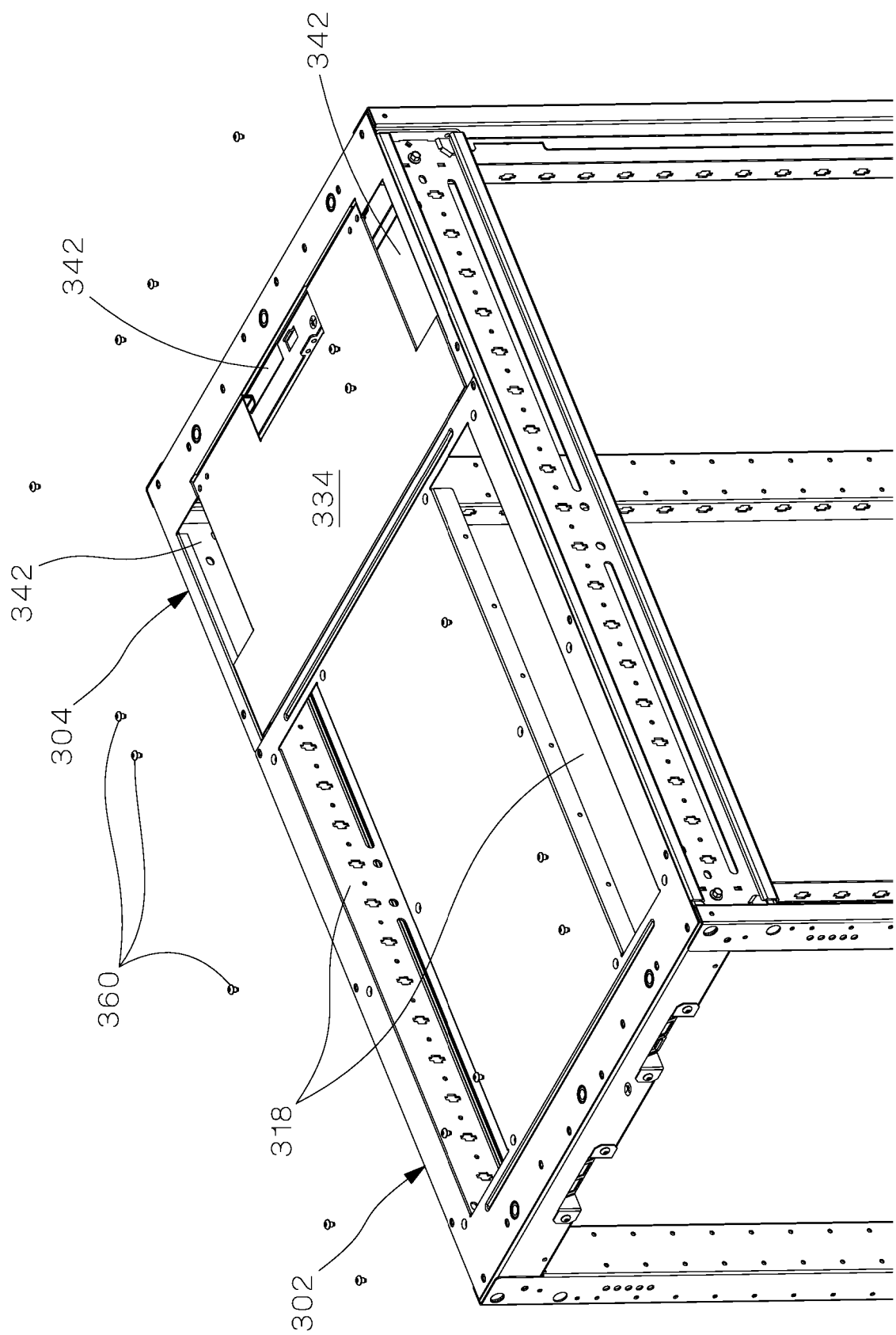
FIG. 18 is an partially exploded perspective view of the top cap of FIG. 16 with the base frame of the data center cabinet of FIG. 1.

As best seen in FIGS. 15-16, top cap 300 has a front plate 302 and a separate rear plate 304 positioned adjacent front plate 302. Together, front plate 302 and rear plate 304 span the entire top of base frame 100 of data center cabinet 10 and define a front edge 306, rear edge 308 opposite front edge 306, opposing first and second side edges 310, 312 extending between front edge 306 and rear edge 308, top surface 314 and bottom surface 316. Front plate 302 and rear plate 304 are both are attached to base frame 100 by screws 360 that extend through holes in front plate 302 and rear plate 304 and into base frame 100. A pair of longitudinal side openings 318 in front plate 302 run substantially parallel to first and second side edges 310, 312 and are inset and spaced apart from front, rear, first side, and second side edges 306, 308, 310, 312. Side openings 318 can be left open to allow the passage of cables. Alternatively, plates 220 can be secured to top cap 300 over side openings 318 (FIG. 13), which can be used to attach brush seal strips to prevent thermal leakage from data center cabinet 10, attach protection bezels 222 to cover side openings 318, or attach exhaust vents 224 to provide thermal exhaust from data center cabinet 10, as shown in FIGS. 13-14 and described above with respect of top cap 200.

Front plate 302 and rear plate 304 together also define large rear opening 326 that is also inset and spaced apart from front, rear, first side, and second side edges 306, 308, 310, 312. Removable door 334 is identical to removable door 234 described above, is positioned over opening 326, and is hinged to front plate 302 to allow door 334 to be rotated between an open position and a closed position and to also be removed from top cap 300. Alternatively, door 334 could also be hinged to rear plate 304. Like door 234, door 334 also has side and rear cutouts 340 in the side and rear edges of door 334, which form apertures 342 between door 334 and rear plate 304 that are preferably large enough to pass cabling and fit power outlet unit cords through. When large diameter power outlet unit plugs need to pass through apertures 342, door 334 can be rotated to an open position to allow passage. Brush seal strips can also be installed on door 334 and/or rear plate 304 to cover apertures 342 to prevent unwanted thermal leakage.

When in the closed position, door 334 is supported by door stop flanges 328 that extend from and are offset from rear plate 304 and into opening 326. As best seen in FIGS. 19-21, rear plate 304 can also have a grounding tab 330 that extends from rear plate 304 into opening 326 and a spring type grounding clip 332 mounted on grounding tab 330 to provide electrical continuity between rear plate 304 and door 334 when door 334 is in the closed position. Grounding tab 330 can be positioned slightly below door stop flanges 328 to provide grounding clip 332 some clearance between grounding tab 330 and door 334. The area of grounding tab 330 under grounding clip 332 and the area of door 334 that contacts grounding clip 332 would also not be painted or otherwise coated to provide a metal on metal contact paths. Although one grounding tab 330 is illustrated, the rear plate 304 may have a second symmetrical grounding tab at the opposite side of the top cap.

Door 334 can also include one or more latches 244 to prevent rotation and removal of door 234 when in the closed position and a lock feature 250 that is configured to retain retractable spring loaded pin 246 in the retracted position, as shown in FIGS. 11-12 and described above with respect to top cap 200.

Figure 22:
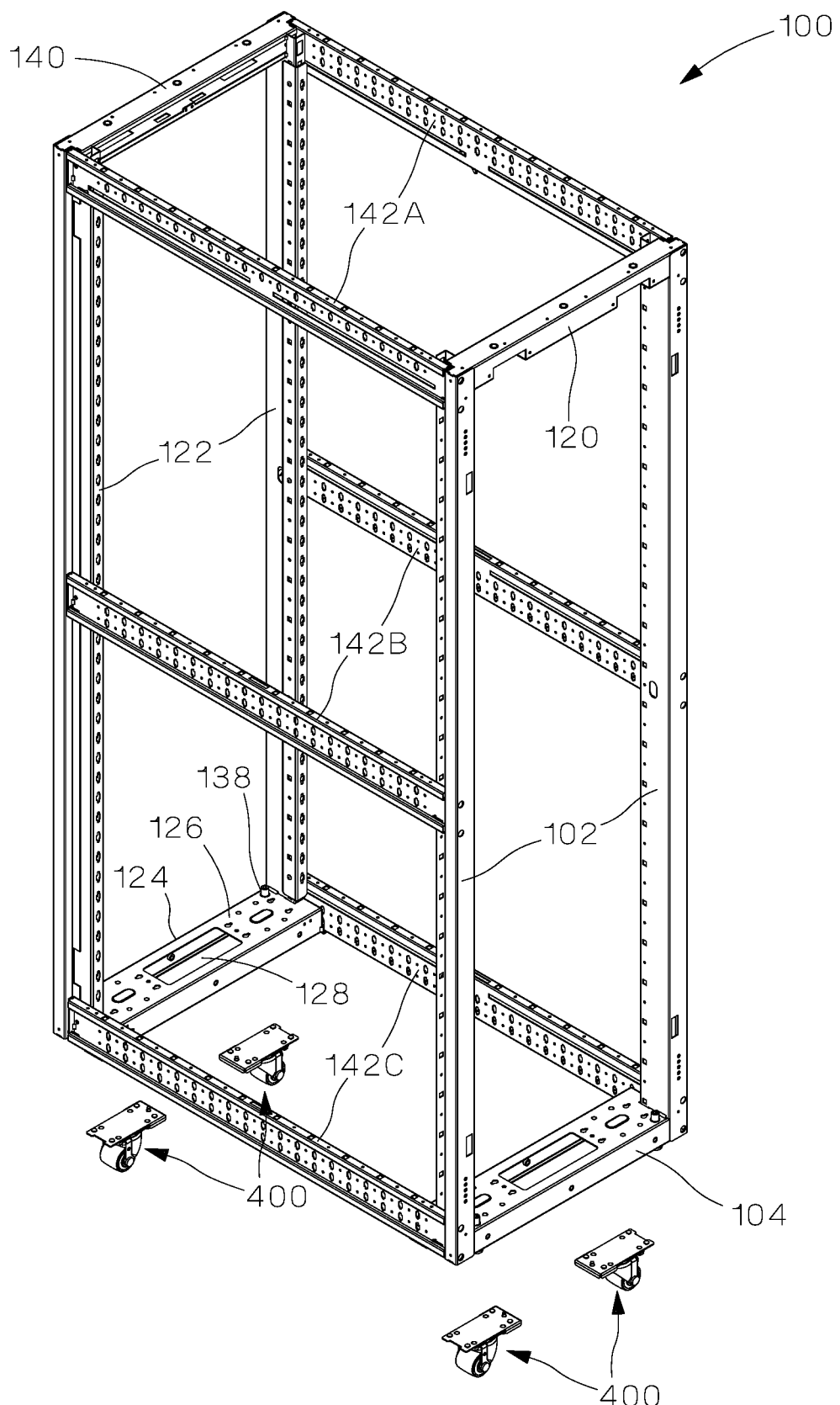
FIG. 22 is an exploded perspective view of the base frame of the data center cabinet of FIG. 1 with example removable transport casters.
Figure 23:
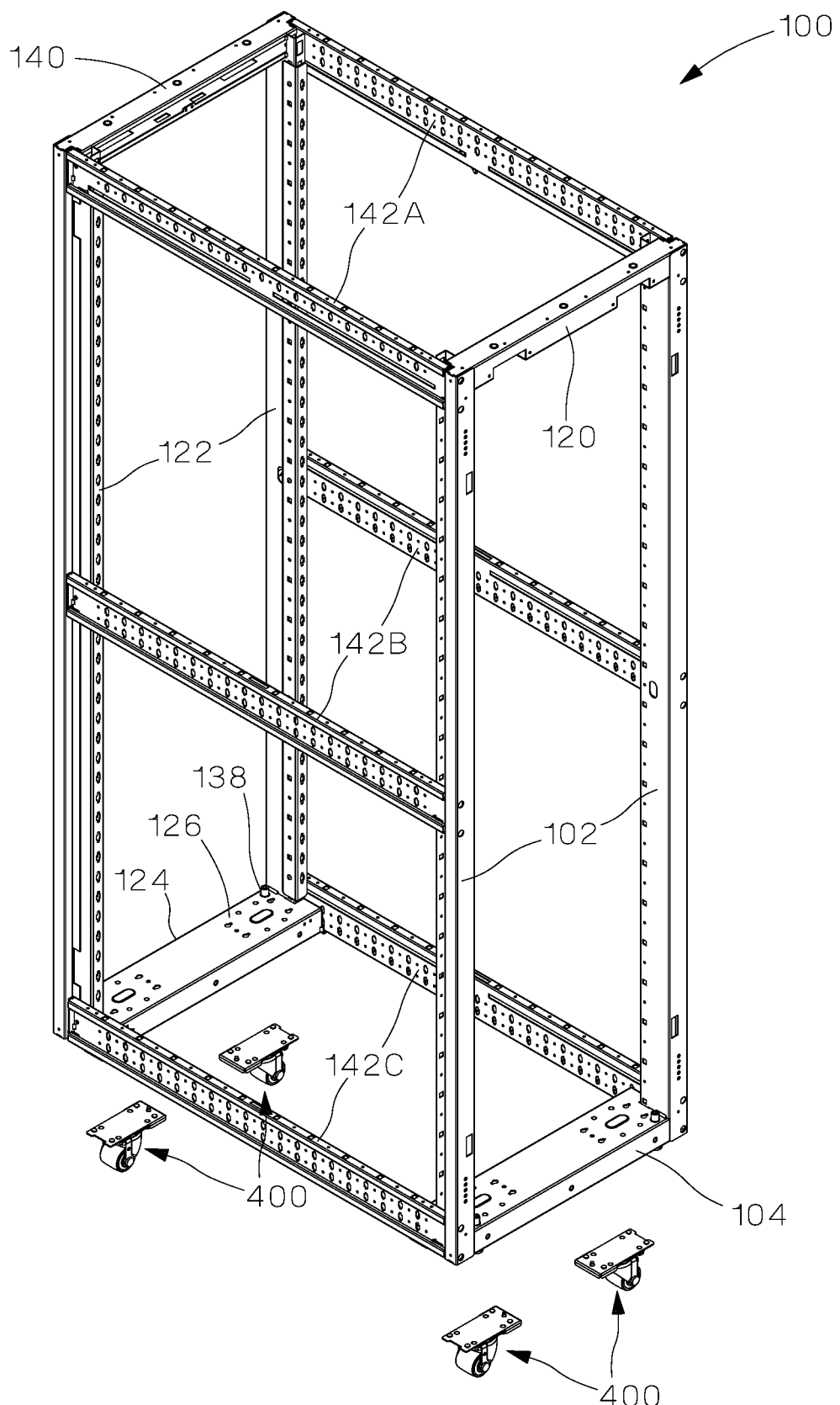
FIG. 23 is an exploded perspective view of an alternative base frame of the data center cabinet of FIG. 22 with example removable transport casters.
Figure 24:
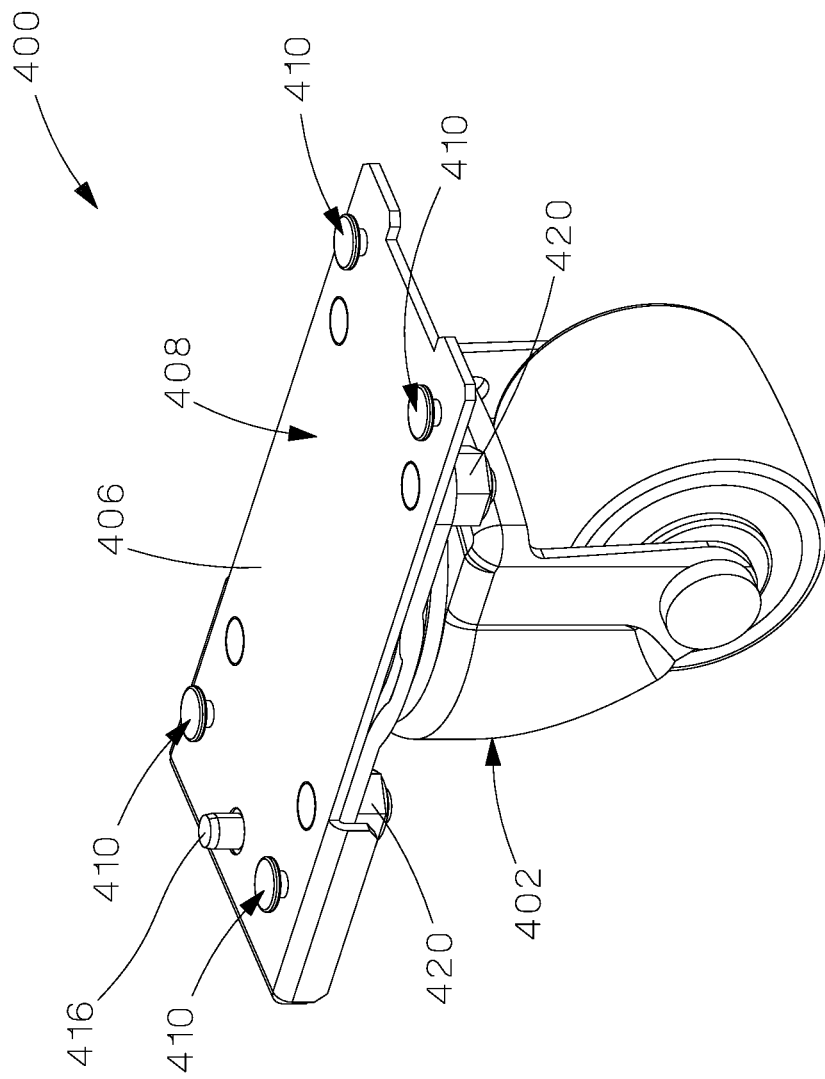
FIG. 24 is a perspective view of one of the removable transport casters of FIG. 22.
Figure 25:
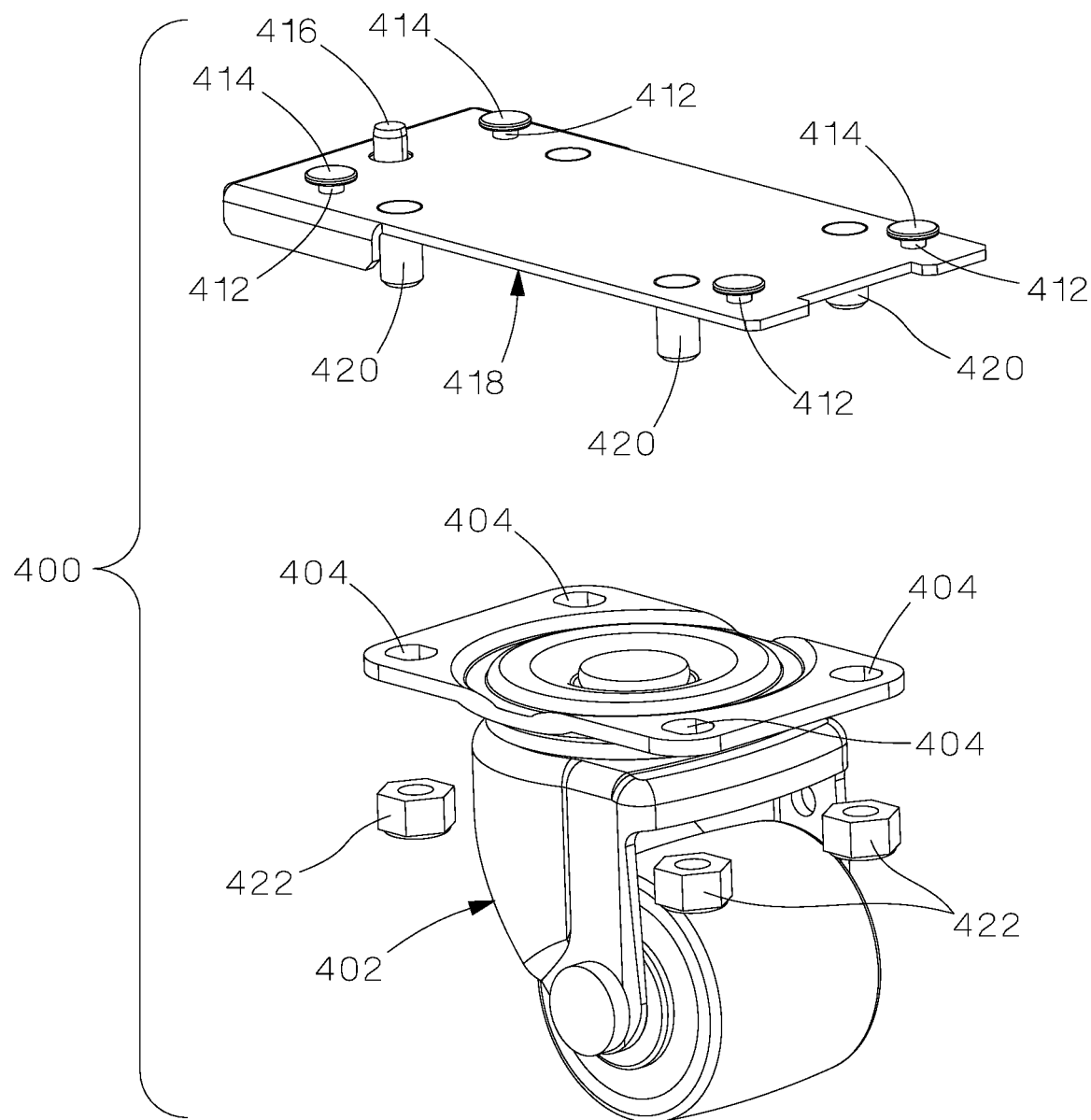
FIG. 25 is an exploded perspective view of the removable transport caster of FIG. 24.

Referring to FIG. 22, base frame 100 of data center cabinet 10 is shown with reusable and removable transport casters 400. FIG. 23 illustrates an alternative base frame of the data center cabinet. As best seen in FIGS. 24-25, transport casters 400 each have a swivel caster 402 and a steel mounting plate 406 that is secured to swivel caster 402 by threaded members 420, which extend from bottom surface 418 of mounting plate 406 and through corresponding holes 404 in swivel caster 402, and lock nuts 422 that are threaded onto corresponding threaded members 420. Mounting plate 406 also has mounting buttons 410 and a retractable spring pin 416 that each extend from top surface 408 of mounting plate 406. Mounting buttons 410 are configured to be received and retained in keyholes 110, 130 in bottom side-to-side beams 104, 124 of base frame 100 of data center cabinet 10, as discussed in more detail below, and each have a neck portion 412 that fits through a first portions 112, 132 of corresponding keyholes 110, 130 and a head portion 414 that has a larger diameter than neck portion 412 and fits through second portions 114, 134 of corresponding keyholes 110, 130, but not through first portions 112, 132 to prevent vertical movement of removable transport casters 400 once they are installed. Retractable spring pin 416 is movable between retracted and extended positions and is biased towards the extended position in which retractable spring pin 416 extends above top surface 408 of mounting plate 406 and is received in lock holes 116, 136 in bottom side-to-side beams 104, 124 of base frame 100 of data center cabinet 10, as discussed in more detail below.

Figure 26:
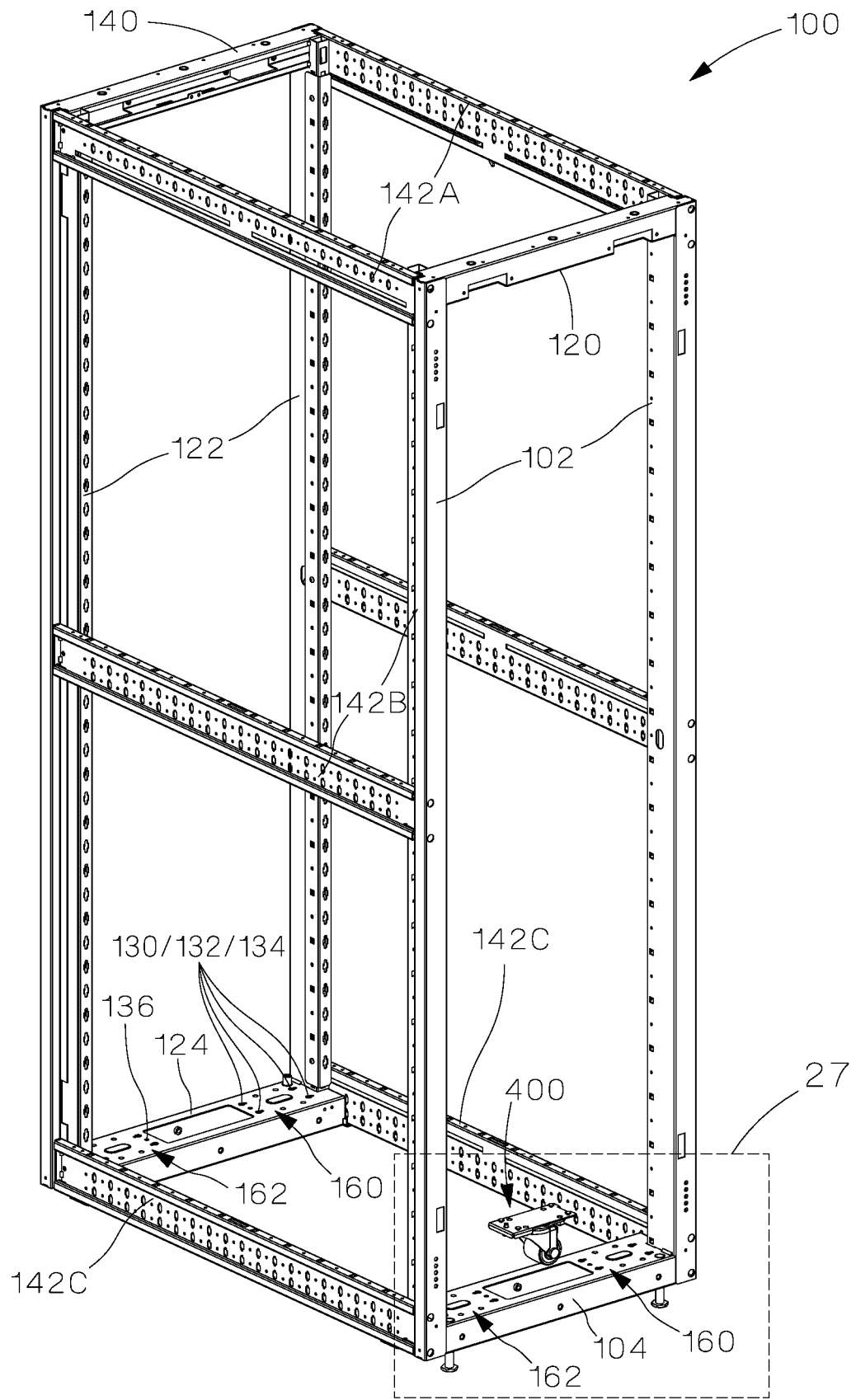
FIG. 26 is a perspective view of the base frame of the data center cabinet of FIG. 1 with a removable transport caster aligned over an opening in a bottom side-to-side beam of the base frame.
Figure 27:
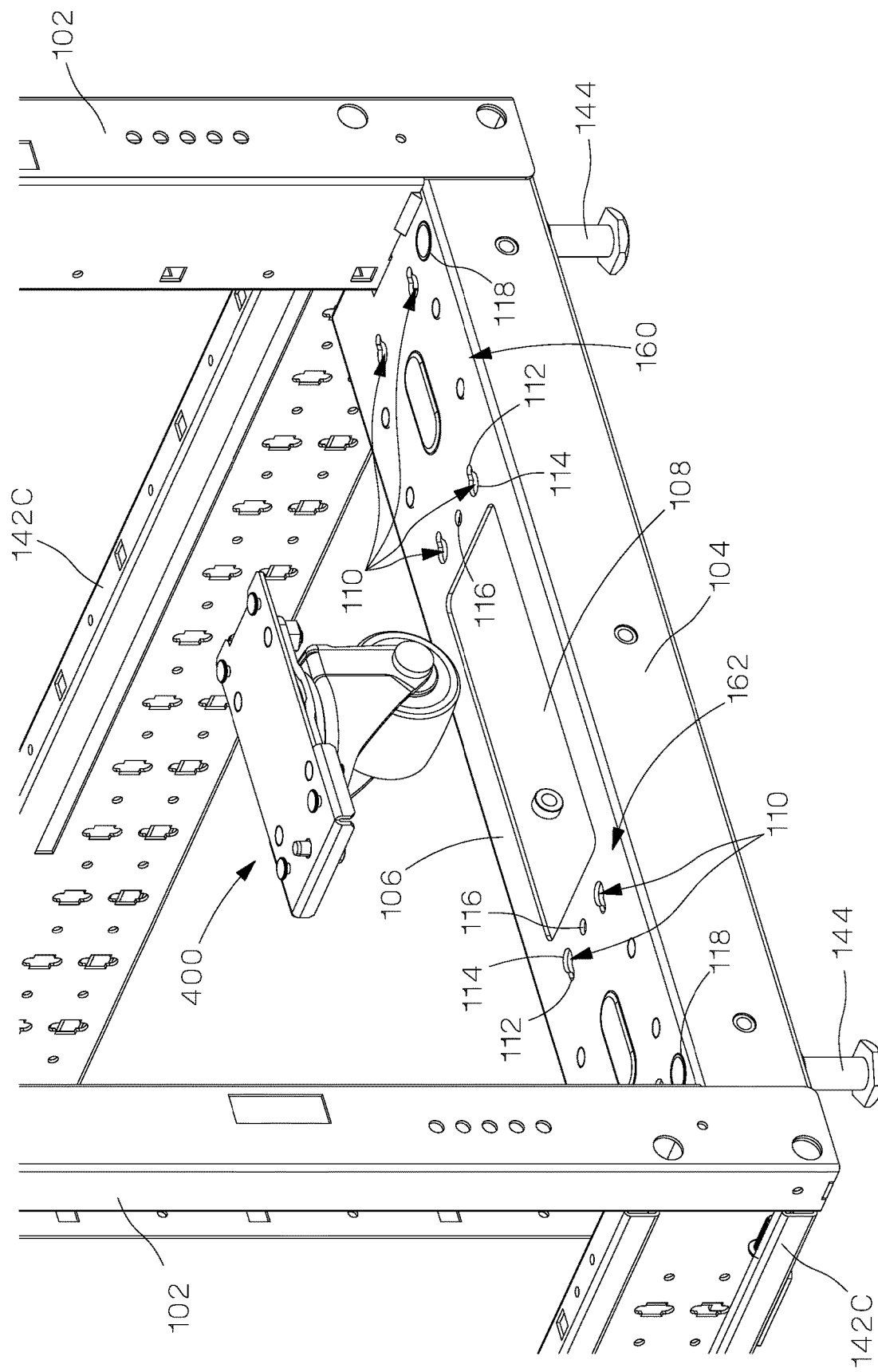
FIG. 27 is an enlarged view of a portion of FIG. 26.
Figure 28:
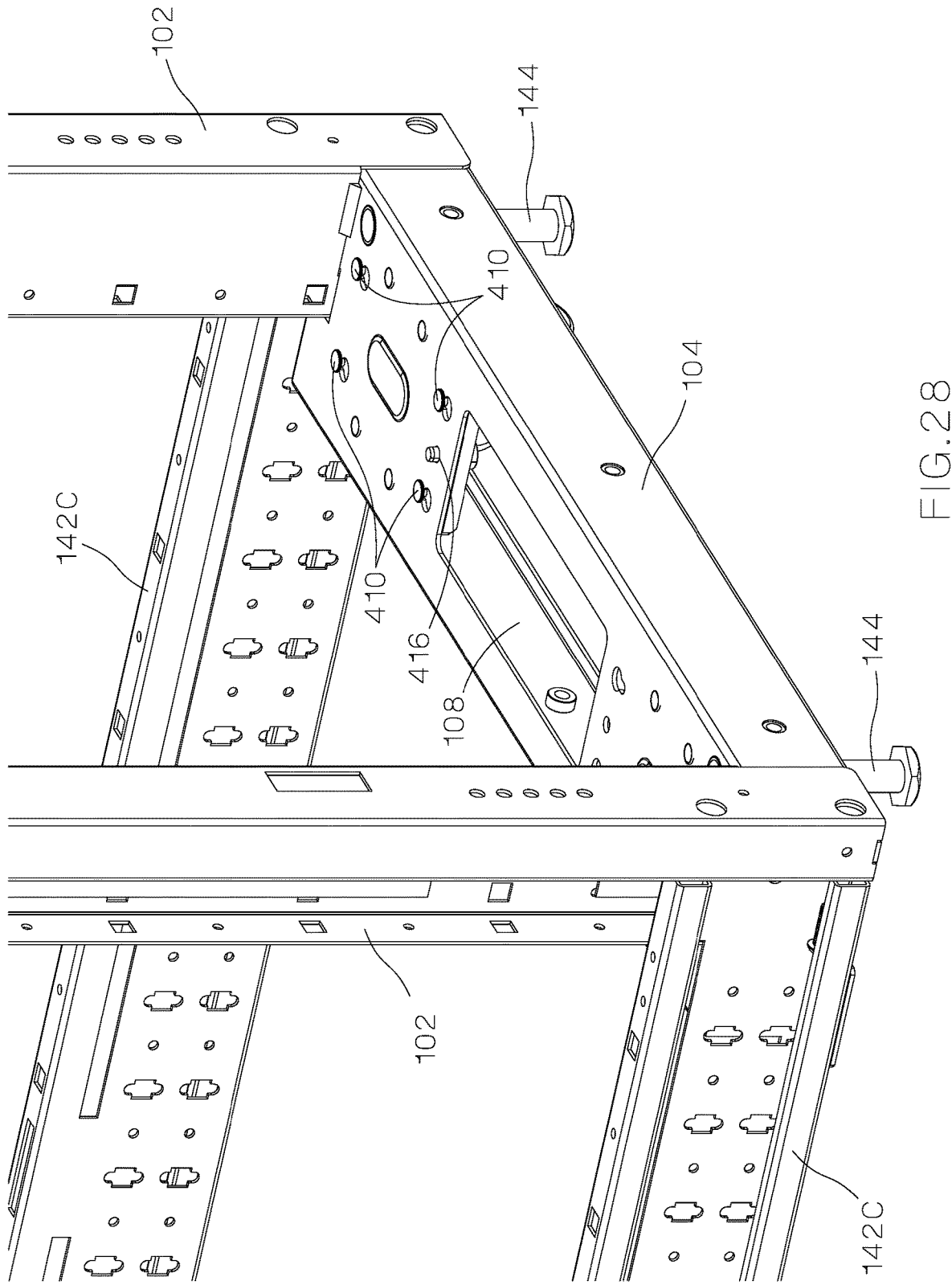
FIG. 28 is the enlarged view of FIG. 27 with the transport caster installed on the bottom side-to-side beam.

Referring to FIGS. 26-28, to receive and secure removable transport casters 400 to base frame 100 of data center cabinet 10, bottom side-to-side beams 104, 124 each have a centrally located, generally rectangular opening 108, 128 formed through top walls 106, 126 of bottom side-to-side beams 104, 124, which is configured to allow removable transport casters 400 to pass through openings 108, 128. Multiple keyholes 110, 130 are also formed in each top wall 106, 126 and, as discussed above, are configured to receive and retain mounting buttons 410 of removable transport casters 400. As best seen in FIG. 27, each bottom side-to-side beam 104, 124 has a first set 160 of keyholes 110, 130 located on one side of opening 108, 128 and a second set 162 of keyholes 110, 130 located on an opposite side of opening 108, 128, which allows a removable transport caster 400 to be secured at each end of bottom side-to-side beams 104, 124 and allows a single opening 108, 128 to be used to install both removable transport casters 400. Lock holes 116, 136 are also formed in each top wall 106, 126 and, as discussed above, are configured to receive retractable spring pins 416 of removable transport casters 400. Each of the first set 160 and second set 162 of keyholes 110, 130 have a corresponding lock hole 116, 136.

To install transport casters 400 on data center cabinet 10, data center cabinet 10 is first raised to a height that transport casters 400 can fit below top wall 106, 126 of bottom side-to-side beams 104, 124 by adjusting or rotating leveling legs 144, which allows a single person to easily perform the installation.

A first transport caster 400 is then be inserted through opening 108 in side-to-side beam 104 until transport caster 400 is positioned below top wall 106 of side-to-side beam 104 and is moveable longitudinally along side-to-side beam 104. Transport caster 400 is then slid along side-to-side beam 104 towards first set 160 of keyholes 110 at a first corner of data center cabinet 10 until head portions 414 of mounting buttons 410 are aligned with second portions 114 of first set 160 of keyholes 110. Transport caster 400 is then raised to insert mounting buttons 410 through keyholes 110. Retractable spring pin 416 is then moved to the retracted position and transport caster 400 is slid further along side-to-side beam 104 until retractable spring pin 416 engages lock hole 116, which will automatically move to the extended position once retractable spring pin 416 is aligned with lock hole 116, and mounting buttons 410 are retained in first portions 112 of keyholes 110.

The same procedure described above can be repeated to secure a second transport caster 400 to the other side of side-to-side beam 104, at second set 162 of keyholes 110, a third transport caster 400 to a first side of side-to-side beam 124, at first set 160 of keyholes 130, and a fourth transport caster 400 to a second side of side-to-side beam 124, at second set 162 of keyholes 130.

Once all transport casters 400 have been installed, data center cabinet 10 is then lowered to rest on transport casters 400 by adjusting or rotating leveling legs 144 in a direction opposite that to raise data center cabinet 10.

To remove transport casters 400 from data center cabinet 10 once it has been position, the reverse of the steps above are performed. Data center cabinet 10 is raised by rotating leveling legs 144 until transport casters 400 no longer contact the floor. Each transport caster 400 is then removed by moving retractable spring pins 416 to the retracted position to disengage them from lock holes 116, 136, sliding transport casters 400 towards openings 108, 128 until head portions 414 of mounting buttons 410 are aligned with second portions 114, 134 of keyholes, 110, 130, lowering transport casters 400 to disengage mounting buttons 410 from keyholes 110, 130, sliding transport casters 400 towards the center of bottom side-to-side beams 104, 124, removing transport casters 400 through openings 108, 128, and lowering data center cabinet 10 to the desired height by rotating leveling legs 144.

Alternatively, if the base frame of the cabinet does not include an opening (see FIG. 23), the cabinet is raised or tilted slightly to gain access to underneath the side to side beam. The transport casters 400 are then placed under the side to side beam and installed as described above. To remove the transport casters 400, the cabinet would be raised or tilted slightly to provide access to the transport casters 400. Once accessible, the transport casters 400 would be removed as described above.

Figure 29:
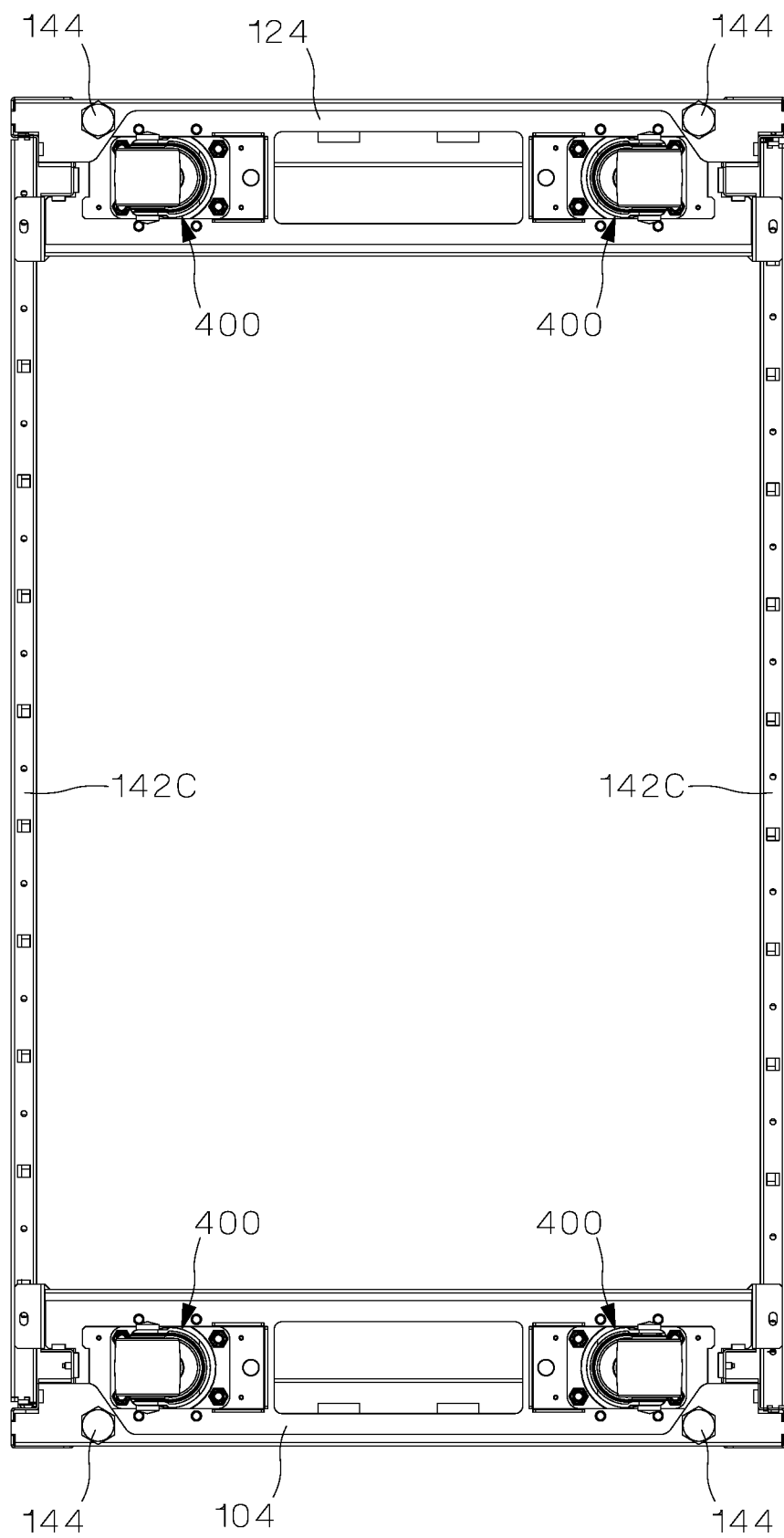
FIG. 29 is a bottom view of the base frame and transport casters of FIG. 22 with the transport casters installed.
Figure 30:
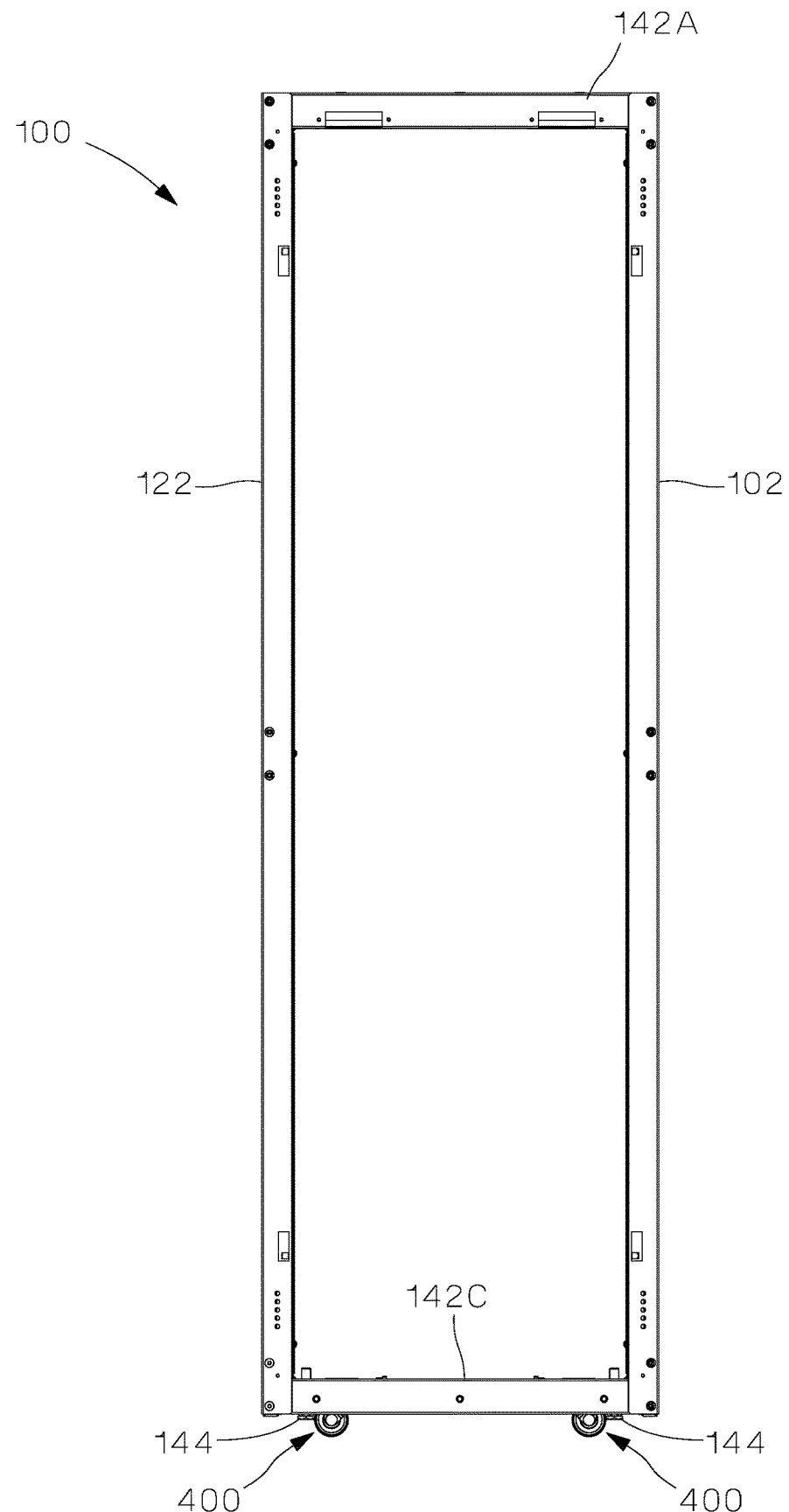
FIG. 30 is a side view of the base frame and transport casters of FIG. 29.

As can be seen in FIG. 29, when installed, transport casters 400 all fit within the footprint of data center cabinet 10, which helps keep the maneuverability of data center cabinet 10 unchanged, which is desirable in the narrow aisles of data centers. In addition, as seen in FIG. 30, transport casters 400 do not add any additional height to data center cabinet 10 than would be added with traditional factory installed casters. This speeds up installation, because leveling legs 144 need to be raised and lowered only slightly for a single person to perform the installation and removal of transport casters 400. Low profile transport casters are also beneficial for rolling data center cabinet 10 thru limited height doorways or passageways.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. A data center cabinet, comprising:
a base frame including a pair of front vertical posts, a first bottom side-to-side beam and a first top side-to-side beam positioned between and connected to the pair of front vertical posts, a pair of back vertical posts, a second bottom side-to-side beam and a second top side-to-side beam positioned between and connected to the pair of back vertical posts, a first pair of front-to-back beams positioned between and connected to one of the pair of front vertical posts and one of the pair of back vertical posts, and a second pair of front-to-back beams positioned between and connected to the other of the pair of front vertical posts and the other of the pair of back vertical posts; wherein the first and second bottom side-to-side beams each comprise an opening configured to allow a removable transport caster to pass through the opening, a first set of keyholes configured to receive and retain a set of mounting buttons of a first removable transport caster, and a second set of keyholes configured to receive and retain a set of mounting buttons of a second removable transport caster.

2. The data center cabinet of claim 1, wherein the first and second bottom side-to-side beams each comprise a first lock hole configured to receive a retractable spring pin of the first removable transport caster and a second lock hole configured to receive a retractable spring pin of the second removable transport caster.

3. The data center cabinet of claim 1, further comprising a first pair of adjustable leveling legs attached to the first bottom side-to-side beam and a second pair of adjustable leveling legs attached to the second bottom side-to-side beam.

4. The data center cabinet of claim 1, wherein the openings are centrally located along the side-to-side beams.

5. The data center cabinet of claim 1, comprising the first and second removable transport casters, the first and second removable transport casters each comprising:

a swivel caster; and a mounting plate secured to the swivel caster, the mounting plate comprising a plurality of mounting buttons extending from a top surface of the mounting plate and configured to be received and retained in a plurality of keyholes in the data center cabinet.

6. The data center cabinet of claim 5, wherein the mounting plate comprises a retractable spring pin extending from the top surface of the mounting plate and configured to be received in a lock hole in the data center cabinet.

7. The data center cabinet of claim 5, wherein the mounting plate is secured to the swivel caster by a plurality of threaded members extending from a bottom surface of the mounting plate and through corresponding holes in the swivel caster and a plurality of lock nuts threaded onto corresponding threaded members.

8. The data center cabinet of claim 5, wherein the mounting button has neck portion and head portion, the head portion having a larger diameter than the neck portion.

9. The data center cabinet of claim 8, wherein the neck portion is configured to fit through a first portion of a corresponding keyhole and the head portion is configured to fit through a second portion of the corresponding keyhole and not the first portion.

10. A transport caster for use with a data center cabinet, the transport caster comprising:

a swivel caster; and a mounting plate secured to the swivel caster, the mounting plate comprising a plurality of mounting buttons extending from a top surface of the mounting plate and configured to be received and retained in a plurality of keyholes in the data center cabinet.

11. The transport caster of claim 10, wherein the mounting plate comprises a retractable spring pin extending from the top surface of the mounting plate and configured to be received in a lock hole in the data center cabinet.

12. The transport caster of claim 10, wherein the mounting plate is secured to the swivel caster by a plurality of threaded members extending from a bottom surface of the mounting plate and through corresponding holes in the swivel caster and a plurality of lock nuts threaded onto corresponding threaded members.

13. The transport caster of claim 10, wherein the mounting button has neck portion and head portion, the head portion having a larger diameter than the neck portion.

* * * * *